US012046267B2

(12) United States Patent
Yamauchi

(10) Patent No.: US 12,046,267 B2
(45) Date of Patent: Jul. 23, 2024

(54) ADVANCED WINDOW PROGRAM-VERIFY

(71) Applicant: SanDisk Technologies LLC, Addison, TX (US)

(72) Inventor: Kazuki Yamauchi, Misato (JP)

(73) Assignee: SanDisk Technologies LLC, Addison, TX (US)

( * ) Notice: Subject to any disclaimer, the term of this patent is extended or adjusted under 35 U.S.C. 154(b) by 189 days.

(21) Appl. No.: 17/895,803

(22) Filed: Aug. 25, 2022

(65) Prior Publication Data

US 2024/0071526 A1 Feb. 29, 2024

(51) Int. Cl.
*G11C 11/34* (2006.01)
*G11C 11/56* (2006.01)
*G11C 16/10* (2006.01)
*G11C 16/34* (2006.01)

(52) U.S. Cl.
CPC ...... *G11C 16/3459* (2013.01); *G11C 11/5628* (2013.01); *G11C 11/5671* (2013.01); *G11C 16/10* (2013.01)

(58) Field of Classification Search
CPC ............ G11C 16/3454; G11C 16/3459; G11C 11/5628; G11C 16/0483
USPC ........................................ 365/185.22, 185.19
See application file for complete search history.

(56) References Cited

U.S. PATENT DOCUMENTS

| | | | | |
|---|---|---|---|---|
| 7,502,260 | B2 | 3/2009 | Li | |
| RE46,014 | E | 5/2016 | Sakai et al. | |
| 9,552,882 | B2 | 1/2017 | Tseng et al. | |
| 10,014,063 | B2 | 7/2018 | Tseng et al. | |
| 10,811,082 | B1 | 10/2020 | Li et al. | |
| 11,087,800 | B1 | 8/2021 | Yabe | |
| 2004/0109362 | A1 * | 6/2004 | Gongwer | G11C 16/3454 365/200 |

* cited by examiner

*Primary Examiner* — Son T Dinh
(74) *Attorney, Agent, or Firm* — Dickinson Wright PLLC; Steven C. Hurles

(57) ABSTRACT

A memory apparatus and operating method are provided. The apparatus includes memory cells connected to word lines and disposed in strings and configured to retain a threshold voltage corresponding to data states. A control means is configured to program and verify the memory cells during a program operation. The memory cells associated with predetermined ones of the data states are not verified until the memory cells associated with specific prior ones of the data states finish programming to define verify windows ranging between each one of the specific prior ones of the data states and each one of the predetermined ones. The control means adjusts the verify windows in response to the memory cells associated with one of the specific prior ones of the data states not finishing programming before the one of the predetermined ones of the at least one of the verify windows is verified.

20 Claims, 26 Drawing Sheets

| State | Er | A | B | C | D | E | F | G |
|---|---|---|---|---|---|---|---|---|
| | Lockout | Program | Program | Program | Program | Program | Program | Program |
| CDL | 1 | 0 | 1 | 0 | 1 | 0 | 1 | 0 |
| BDL | 1 | 1 | 0 | 0 | 1 | 1 | 0 | 0 |
| ADL | 1 | 1 | 1 | 1 | 0 | 0 | 0 | 0 |
| DDL | 1 | 0 | 0 | 0 | 0 | 0 | 0 | 0 |

*FIG. 13A*

| State | Er | A | B | C | D | E | F | G | |
|---|---|---|---|---|---|---|---|---|---|
| | Lockout | Program | Program | Program | Program | Program | Program | Program | Lockout |
| CDL | 1 | 0 | 1 | 0 | 1 | 0 | 1 | 0 | 1 |
| BDL | 1 | 1 | 0 | 0 | 1 | 1 | 0 | 0 | 1 |
| ADL | 1 | 1 | 1 | 1 | 0 | 0 | 0 | 0 | 1 |
| DDL | 1 | QPW | QPW | QPW | QPW | QPW | QPW | 0 | 0 |

*FIG. 13B*

| State | Er | A | B | C | D | E | F | G | |
|---|---|---|---|---|---|---|---|---|---|
| | Lockout | Lockout | Lockout | Lockout | Lockout | Program | Program | Program | Lockout |
| CDL | 1 | 1 | 1 | 1 | 1 | 0 | 1 | 0 | 1 |
| BDL | 1 | 1 | 1 | 1 | 1 | 1 | 0 | 0 | 1 |
| ADL | Available | | | | | | | | |
| DDL | 1 | 1 | 1 | 1 | 1 | QPW | QPW | 0 | 0 |

*FIG. 13C*

| State | Er | A | B | C | D | E | F | G | |
|---|---|---|---|---|---|---|---|---|---|
| | Lockout | Lockout | Lockout | Lockout | Lockout | Lockout | Lockout | Program | Lockout |
| CDL | 1 | 1 | 1 | 1 | 1 | 1 | 1 | 0 | 1 |
| BDL | Available | | | | | | | | |
| ADL | Available | | | | | | | | |
| DDL | 1 | 1 | 1 | 1 | 1 | 1 | 1 | 0 | 0 |

*FIG. 13D*

| STATE | PCV LOOP | COMP LOOP |
|---|---|---|
| S1 | 0 | 8 |
| S2 | 2 | 9 |
| S3 | 4 | 10 |
| S4 | 5 | 11 |
| S5 | 6 | 13 |
| S6 | 7 | 14 |
| S7 | 8 | 15 |
| S8 | 9 | 17 |
| S9 | 11 | 18 |
| S10 | 12 | 20 |
| S11 | 13 | 21 |
| S12 | 14 | 23 |
| S13 | 15 | 23 |
| S14 | 17 | 26 |
| S15 | 18 | 28 |

STATE N COMPLETE BEFORE STATE N+7 VERIFY STARTS!

FIG. 15

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 0 | 1 | 1 | 0 | 0 | 0 | 0 | 1 |
| BDL | 1 | 0 | 0 | 1 | 1 | 1 | 0 | 0 | 1 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |

VERIFY WINDOW SHIFTING

XDL RELEARSE AFTER S7 COMPLETE, NEW VERIFY WINDOW BECOMES FOR NOT [A/B/C/T/ = (1/1/1/1)] CELLS

VERIFY WINDOW

S8-S15 Pvfy WILL NOT BE STARTED TILL S1-S7 PROGRAM ARE COMPLETED

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |

IF STATE N IS NOT COMPLETED BEFORE STATE N+7 VERIFY STARTS, STATE N+7 WILL HAVE OP

*FIG. 17*

HIGHER STATES WINDOW Pvfy
PCHSEL SCAN AT R_CLK(R1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |
| SDL | 0 | 0 | 0 | 0 | 0 | 0 | 0 | 0 | 1 | 1 | 1 | 1 | 1 | 1 | 1 | 1 |
| SEN | X | X | X | X | X | X | X | X | X | X | X | X | X | X | X | X |

S = ~(A & B & C & T) & ~X

SWITCH

SWITCH TO NORMAL WINDOW Pvfy
PCHSEL SCAN AT RWL_CLK(RWL1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0/0/1 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0/0/1 | 0 | 0 | 0 | 0 | 0 | 0 | 0 |
| SDL | 0 | 1 | 1 | 1 | 1 | 1 | 1 | 1 | 0 | 0 | 0 | 0 | 0 | 0 | 0 | 0 |
| SEN | X | X | X | X | X | X | X | X | X | X | X | X | X | X | X | X |

SET DL -> S = ~(A & B & C & T) & X

FIG. 18

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |
| SDL | X | X | X | X | X | X | X | X | X | X | X | X | X | X | X | X |
| SEN | X | X | X | X | X | X | X | X | X | X | X | X | X | X | X | X |

FIG. 19A

| Pvfy | PCHSEL TARGET (SET SDL) | XDL | CLK | CONDITION | SCAN (BEFORE XDL RELEASE) | SCAN (AFTER XDL RELEASE) | SCAN (AFTER ADL RELEASE) | SCAN (AFTER BDL RELEASE) | SCAN (AFTER CDL RELEASE) |
|---|---|---|---|---|---|---|---|---|---|
| S1-S7 | S1-S7 | | | SDL_SET_S1-S7 | | | | | |
| S2-S8 | S2-S8 | | R_CLK | SDL_SET_S8 & COMP_PROG_S[1] | | | | | |
| S3-S9 | S3-S9 | 1 | | SDL_SET_S9 & COMP_PROG_S[2] | | | | | |
| S4-S10 | S4-S10 | | | SDL_SET_S10 & COMP_PROG_S[3] | S = ~(A & B & C & T) & X | | | | |
| S5-S11 | S5-S11 | | | SDL_SET_S11 & COMP_PROG_S[4] | | | | | |
| S6-S12 | S6-S12 | | | SDL_SET_S12 & COMP_PROG_S[5] | | | | | |
| S7-S13 | S7-S13 | | | SDL_SET_S13 & COMP_PROG_S[6] | | | | | |
| **S1 TO S8-S15** | S8-S15 | 0 | R_CLK | SDL_SET_S8-S15 & **~COMP_PROG_S[1]** | S = ~(A & B & C & T) & ~X | | | | |
| | S1-S7 | 1 | RWL_CLK | SET_DATAL_S8 & **~COMP_PROG_S[1]** | B/T = SEN \| B/T -> S = ~ (A & B & C & T) & X | | | | |
| **S2 TO S9-15** | S9-S15 | 0 | R_CLK | SDL_SET_S9-S15 & **~COMP_PROG_S[2]** | S = ~(A & B & C & T) & ~X | | | | |
| | S2-S8 | 1 | RWL_CLK | SET_DATAL_S9 & **~COMP_PROG_S[1] & ~COMP_PROG_S[2]** | B/C/T = SEN \| B/C/T -> S = ~ (A & B & C & T) & X | | | | |
| **S3 TO S10-15** | S10-S15 | 0 | R_CLK | SDL_SET_S10-S15 & **~COMP_PROG_S[3]** | S = ~(A & B & C & T) & ~X | | | | |
| | S3-S9 | 1 | RWL_CLK | SET_DATAL_S10 & **~COMP_PROG_S[2] & ~COMP_PROG_S[3]** | C/T = SEN C/T -> S = ~(A & B & C & T) & X | | | | |
| **S4 TO S11-S15** | S11-S15 | 0 | R_CLK | SDL_SET_S11-S15 & **~COMP_PROG_S[4]** | S = ~(A & B & C & T) & ~X | IF STATE N IS **NOT** COMPLETED BEFORE STATE N+7 VERIFY STARTS, HIGHER STATES WINDOW Pvfy IS APPLIED | | | |
| | S4-S10 | 1 | RWL_CLK | SET_DATAL_S11 & **~COMP_PROG_S[3] & ~COMP_PROG_S[4]** | A/T = SEN \| A/T -> S = ~(A & B & C & T) & X | | | | |
| **S5 TO S12-S15** | S12-S15 | 0 | R_CLK | SDL_SET_S12-S15 & **~COMP_PROG_S[5]** | S = ~(A & B & C & T) & ~X | | | | |
| | S5-S11 | 1 | RWL_CLK | SET_DATAL_S12 & **~COMP_PROG_S[4] & ~COMP_PROG_S[5]** | A/C/T = SEN \| A/C/T -> S = ~(A & B & C & T) & X | | | | |
| | | | | | | | | | |

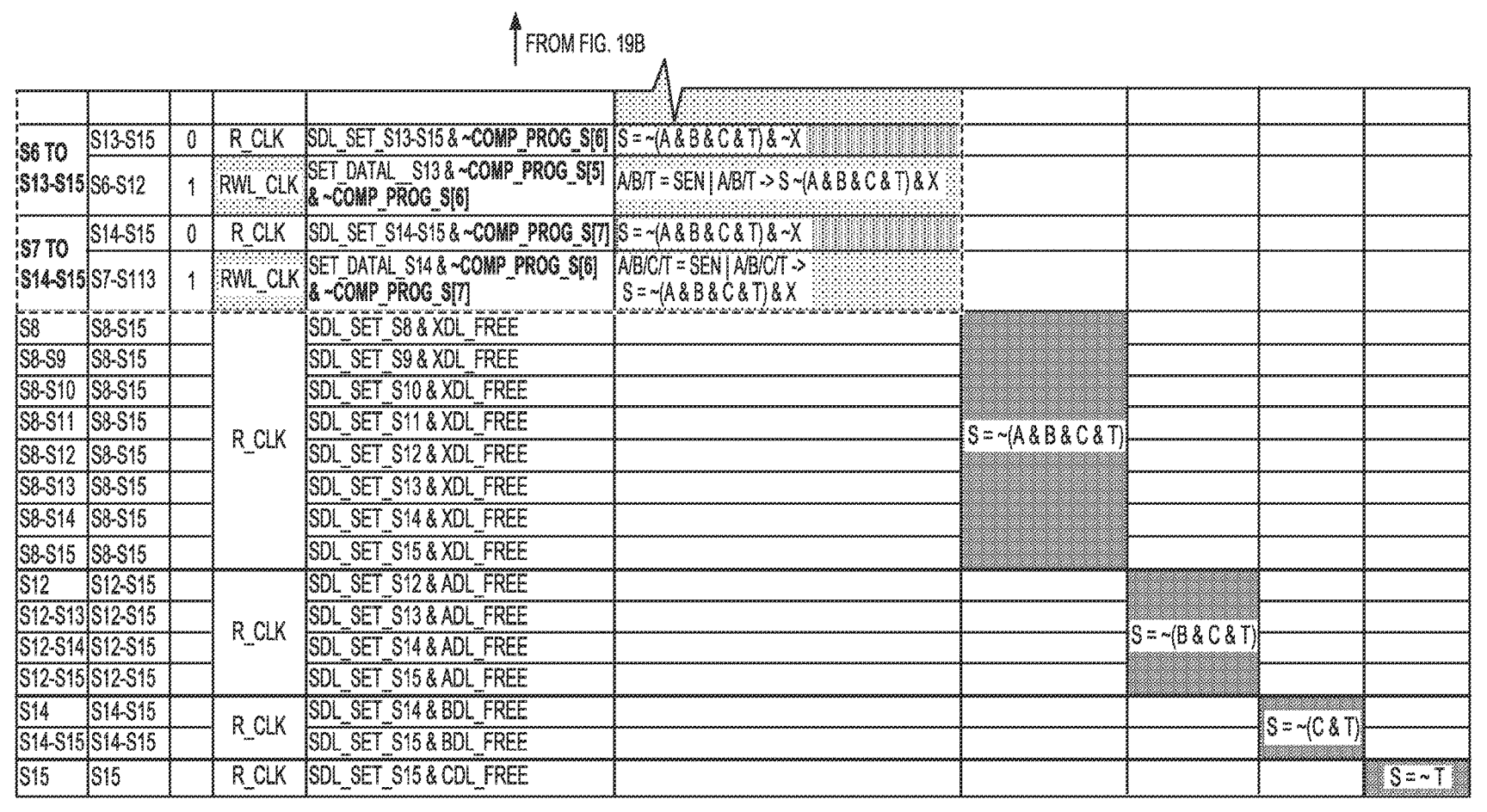

FROM FIG. 19B

| | | | | | | | | | |
|---|---|---|---|---|---|---|---|---|---|
| **S6 TO S13-S15** | S13-S15 | 0 | R_CLK | SDL_SET_S13-S15 & **~COMP_PROG_S[6]** | S = ~(A & B & C & T) & ~X | | | | |
| | S6-S12 | 1 | RWL_CLK | SET_DATAL_S13 & **~COMP_PROG_S[5] & ~COMP_PROG_S[6]** | A/B/T = SEN \| A/B/T -> S ~(A & B & C & T) & X | | | | |
| **S7 TO S14-S15** | S14-S15 | 0 | R_CLK | SDL_SET_S14-S15 & **~COMP_PROG_S[7]** | S = ~(A & B & C & T) & ~X | | | | |
| | S7-S113 | 1 | RWL_CLK | SET_DATAL_S14 & **~COMP_PROG_S[6] & ~COMP_PROG_S[7]** | A/B/C/T = SEN \| A/B/C/T -> S = ~(A & B & C & T) & X | | | | |
| S8 | S8-S15 | | R_CLK | SDL_SET_S8 & XDL_FREE | | S = ~(A & B & C & T) | | | |
| S8-S9 | S8-S15 | | | SDL_SET_S9 & XDL_FREE | | | | | |
| S8-S10 | S8-S15 | | | SDL_SET_S10 & XDL_FREE | | | | | |
| S8-S11 | S8-S15 | | | SDL_SET_S11 & XDL_FREE | | | | | |
| S8-S12 | S8-S15 | | | SDL_SET_S12 & XDL_FREE | | | | | |
| S8-S13 | S8-S15 | | | SDL_SET_S13 & XDL_FREE | | | | | |
| S8-S14 | S8-S15 | | | SDL_SET_S14 & XDL_FREE | | | | | |
| S8-S15 | S8-S15 | | | SDL_SET_S15 & XDL_FREE | | | | | |
| S12 | S12-S15 | | R_CLK | SDL_SET_S12 & ADL_FREE | | | S = ~(B & C & T) | | |
| S12-S13 | S12-S15 | | | SDL_SET_S13 & ADL_FREE | | | | | |
| S12-S14 | S12-S15 | | | SDL_SET_S14 & ADL_FREE | | | | | |
| S12-S15 | S12-S15 | | | SDL_SET_S15 & ADL_FREE | | | | | |
| S14 | S14-S15 | | R_CLK | SDL_SET_S14 & BDL_FREE | | | | S = ~(C & T) | |
| S14-S15 | S14-S15 | | | SDL_SET_S15 & BDL_FREE | | | | | |
| S15 | S15 | | R_CLK | SDL_SET_S15 & CDL_FREE | | | | | S = ~ T |

FIG. 19B (CONT.)

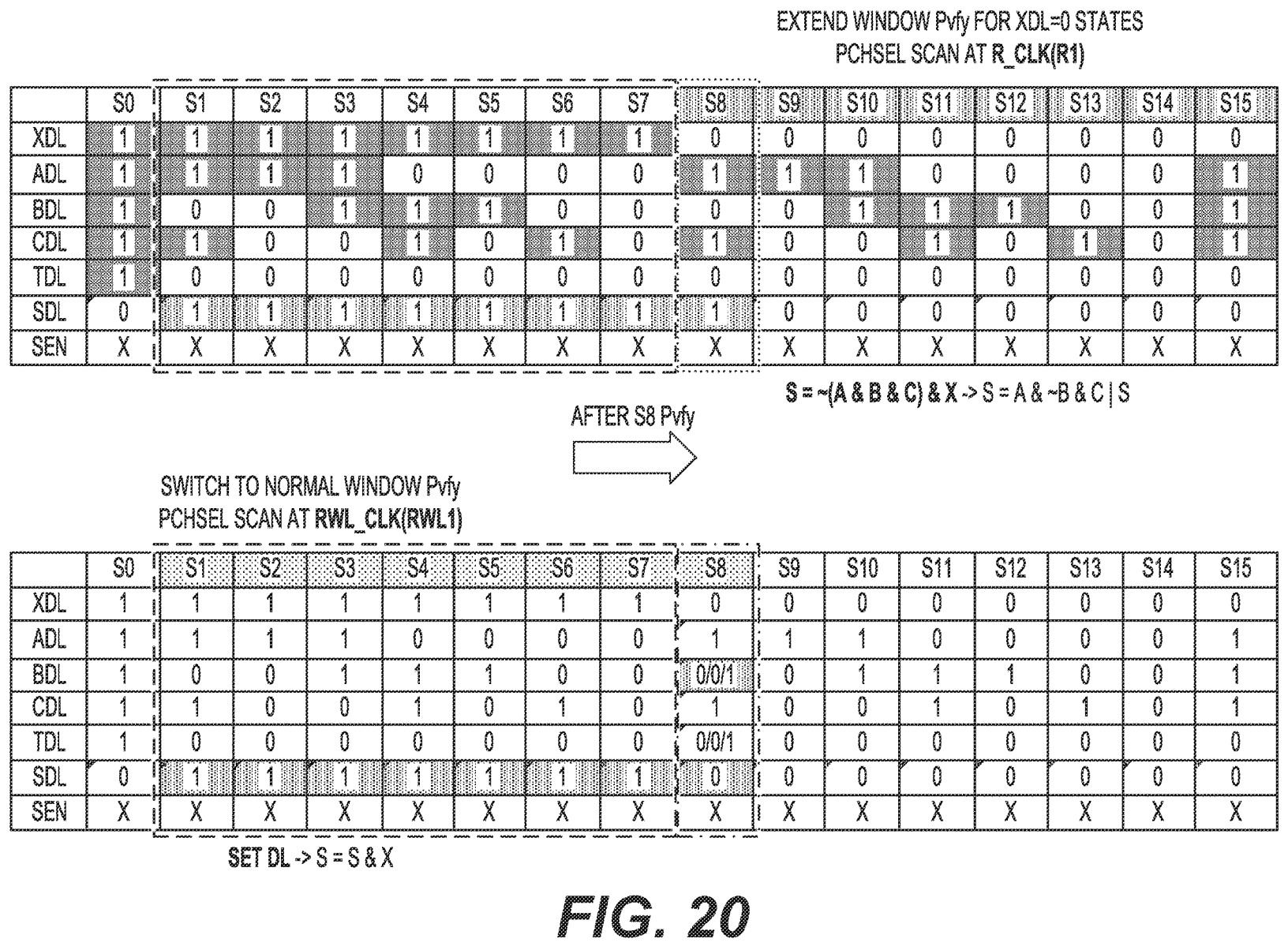

EXTEND WINDOW Pvfy FOR XDL=0 STATES
PCHSEL SCAN AT R_CLK(R1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |
| SDL | 0 | 1 | 1 | 1 | 1 | 1 | 1 | 1 | 1 | 0 | 0 | 0 | 0 | 0 | 0 | 0 |
| SEN | X | X | X | X | X | X | X | X | X | X | X | X | X | X | X | X |

S = ~(A & B & C) & X -> S = A & ~B & C | S

AFTER S8 Pvfy

SWITCH TO NORMAL WINDOW Pvfy
PCHSEL SCAN AT RWL_CLK(RWL1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0/0/1 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0/0/1 | 0 | 0 | 0 | 0 | 0 | 0 | 0 |
| SDL | 0 | 1 | 1 | 1 | 1 | 1 | 1 | 1 | 0 | 0 | 0 | 0 | 0 | 0 | 0 | 0 |
| SEN | X | X | X | X | X | X | X | X | X | X | X | X | X | X | X | X |

SET DL -> S = S & X

*FIG. 20*

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| XDL | 1 | 1 | 1 | 1 | 1 | 1 | 1 | 1 | 0 | 0 | 0 | 0 | 0 | 0 | 0 | 0 |
| ADL | 1 | 1 | 1 | 1 | 0 | 0 | 0 | 0 | 1 | 1 | 1 | 0 | 0 | 0 | 0 | 1 |
| BDL | 1 | 0 | 0 | 1 | 1 | 1 | 0 | 0 | 0 | 0 | 1 | 1 | 1 | 0 | 0 | 1 |
| CDL | 1 | 1 | 0 | 0 | 1 | 0 | 1 | 0 | 1 | 0 | 0 | 1 | 0 | 1 | 0 | 1 |
| TDL | 1 | 0 | 0 | 0 | 0 | 0 | 0 | 0 | 0 | 0 | 0 | 0 | 0 | 0 | 0 | 0 |
| SDL | X | X | X | X | X | X | X | X | X | X | X | X | X | X | X | X |
| SEN | X | X | X | X | X | X | X | X | X | X | X | X | X | X | X | X |

FIG. 21A

| Pvfy | PCHSEL TARGET (SET SDL) | CLK | CONDITION | SCAN (BEFORE XDL RELEASE) | SCAN (AFTER XDL RELEASE) | SCAN (AFTER ADL RELEASE) | SCAN (AFTER BDL RELEASE) | SCAN (AFTER CDL RELEASE) |
|---|---|---|---|---|---|---|---|---|
| S1-S7 | S1-S7 | R_CLK | SDL_SET_S1/2/3/4/5/6/7 | S = ~(A & B & C & T) & X | | | | |
| S2-S8 | S2-S8 | | SDL_SET_S8 & COMP_PROG_S[1] | | | | | |
| S3-S9 | S3-S9 | | SDL_SET_S9 & COMP_PROG_S[2] | | | | | |
| S4-S10 | S4-S10 | | SDL_SET_S10 & COMP_PROG_S[3] | | | | | |
| S5-S11 | S5-S11 | | SDL_SET_S11 & COMP_PROG_S[4] | | | | | |
| S6-S12 | S6-S12 | | SDL_SET_S12 & COMP_PROG_S[5] | | | | | |
| S7-S13 | S7-S13 | | SDL_SET_S13 & COMP_PROG_S[6] | | | | | |
| **S1-S8** | S1-S8 | R_CLK | SDL_SET_S8 & **~COMP_PROG_S[1]** | S = ~(A & B & C) & X -> S = A & B & C \| S | | | | |
| | | RWL_CLK | SET_DATAL_S8 & **~COMP_PROG_S[1]** | B/T = SEN \| B/T -> S = S& X | | | | |
| **S 1/2 - S9** | S1-S9 | R_CLK | SDL_SET_S9 & **~COMP_PROG_S[2]** | S = ~(A & B & C) & X -> S = A & ~B \| S | | | | |
| | | RWL_CLK | SET_DATAL_S9 & **~COMP_PROG_S[1] & ~COMP_PROG_S[2]** | B/C/T = SEN \| B/C/T -> S = S & X | | | | |
| **S 1/2/3 – S10** | S1-S10 | R_CLK | SDL_SET_S10 & **~COMP_PROG_S[3]** | S = ~(A & B & C) -> S = ~(~X & ~A) & S | | | | |
| | | RWL_CLK | SET_DATAL_S10 & **~COMP_PROG_S[2] & ~COMP_PROG_S[3]** | C/T = SEN C/T -> S = S & X | | | | |
| **S 1/2/3/4 – S11** | **S1-S12** | R_CLK | SDL_SET_S11 & **~COMP_PROG_S[4]** | S = ~(A & B & C) -> S = ~(~X & ~A & ~B) & S | IF STATE N IS NOT COMPLETED BEFORE STATE N+7 VERIFY STARTS, VERIFY WINDOW WILL BE EXTENDED 7 + α STATES | | | |
| | | RWL_CLK | SET_DATAL_S11 & **~COMP_PROG_S[3] & ~COMP_PROG_S[4]** | A/T = SEN \| A/T -> S = S & X | | | | |
| **S 1/2/3/4/5 – S12** | S1-S12 | R_CLK | SDL_SET_S12 & **~COMP_PROG_S[5]** | S = ~(A & B & C) -> S = ~(~ X & ~A & ~B) & S | | | | |
| | | RWL_CLK | SET_DATAL_S12 & **~COMP_PROG_S[4] & ~COMP_PROG_S[5]** | A/C/T = SEN \| A/C/T -> S = S & X | | | | |
| | | | | | | | | |

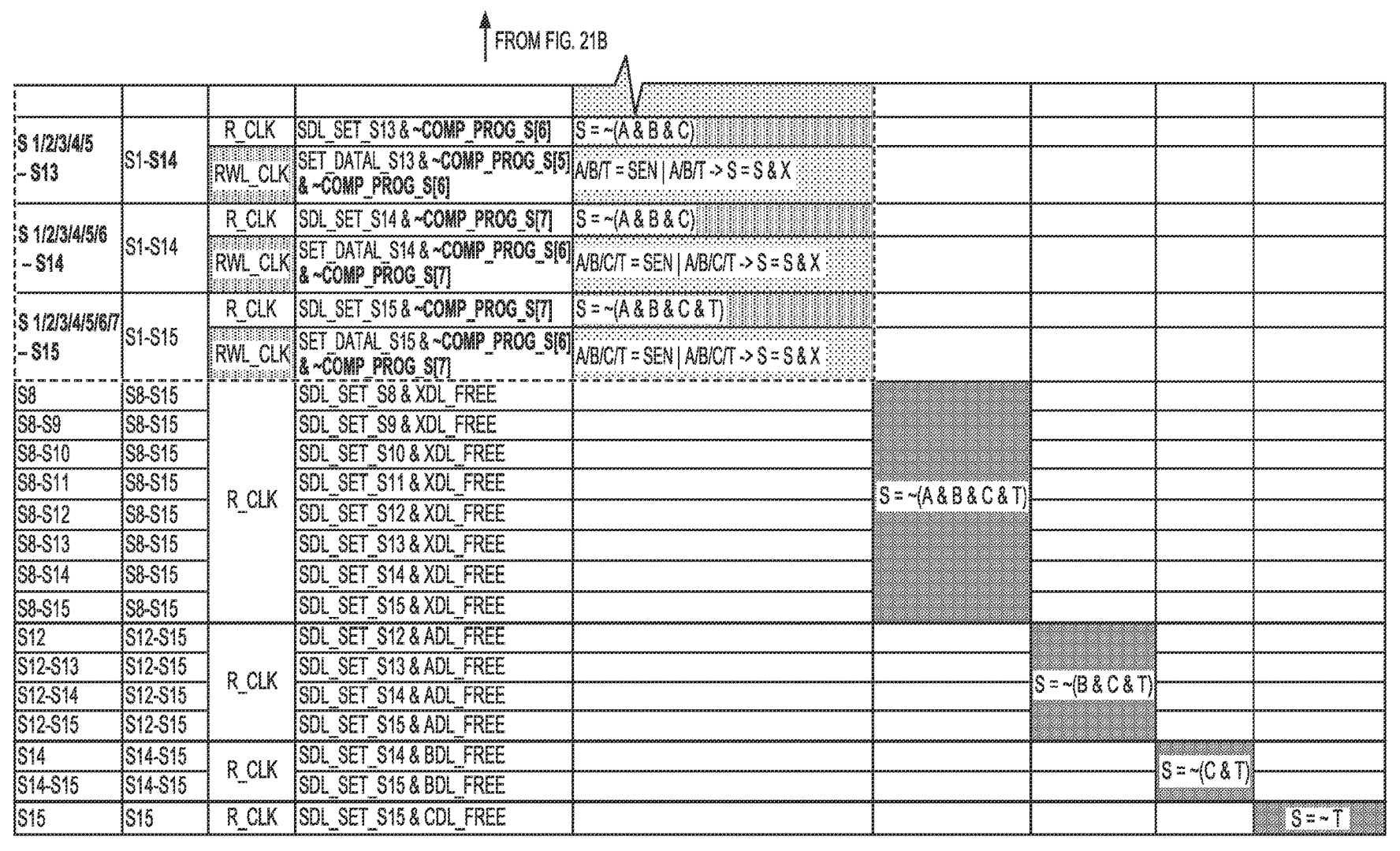

FROM FIG. 21B

| | | | | | | | | |
|---|---|---|---|---|---|---|---|---|
| S 1/2/3/4/5 ~ S13 | S1-S14 | R_CLK | SDL_SET_S13 & ~COMP_PROG_S[6] | S = ~(A & B & C) | | | | |
| | | RWL_CLK | SET_DATAL_S13 & ~COMP_PROG_S[5] & ~COMP_PROG_S[6] | A/B/T = SEN \| A/B/T -> S = S & X | | | | |
| S 1/2/3/4/5/6 ~ S14 | S1-S14 | R_CLK | SDL_SET_S14 & ~COMP_PROG_S[7] | S = ~(A & B & C) | | | | |
| | | RWL_CLK | SET_DATAL_S14 & ~COMP_PROG_S[6] & ~COMP_PROG_S[7] | A/B/C/T = SEN \| A/B/C/T -> S = S & X | | | | |
| S 1/2/3/4/5/6/7 ~ S15 | S1-S15 | R_CLK | SDL_SET_S15 & ~COMP_PROG_S[7] | S = ~(A & B & C & T) | | | | |
| | | RWL_CLK | SET_DATAL_S15 & ~COMP_PROG_S[6] & ~COMP_PROG_S[7] | A/B/C/T = SEN \| A/B/C/T -> S = S & X | | | | |
| S8 | S8-S15 | R_CLK | SDL_SET_S8 & XDL_FREE | | | | | |
| S8-S9 | S8-S15 | | SDL_SET_S9 & XDL_FREE | | | | | |
| S8-S10 | S8-S15 | | SDL_SET_S10 & XDL_FREE | | | | | |
| S8-S11 | S8-S15 | | SDL_SET_S11 & XDL_FREE | | S = ~(A & B & C & T) | | | |
| S8-S12 | S8-S15 | | SDL_SET_S12 & XDL_FREE | | | | | |
| S8-S13 | S8-S15 | | SDL_SET_S13 & XDL_FREE | | | | | |
| S8-S14 | S8-S15 | | SDL_SET_S14 & XDL_FREE | | | | | |
| S8-S15 | S8-S15 | | SDL_SET_S15 & XDL_FREE | | | | | |
| S12 | S12-S15 | R_CLK | SDL_SET_S12 & ADL_FREE | | | | | |
| S12-S13 | S12-S15 | | SDL_SET_S13 & ADL_FREE | | | S = ~(B & C & T) | | |
| S12-S14 | S12-S15 | | SDL_SET_S14 & ADL_FREE | | | | | |
| S12-S15 | S12-S15 | | SDL_SET_S15 & ADL_FREE | | | | | |
| S14 | S14-S15 | R_CLK | SDL_SET_S14 & BDL_FREE | | | | S = ~(C & T) | |
| S14-S15 | S14-S15 | | SDL_SET_S15 & BDL_FREE | | | | | |
| S15 | S15 | R_CLK | SDL_SET_S15 & CDL_FREE | | | | | S = ~T |

FIG. 21B (CONT.)

APPLYING EACH OF A SERIES OF PROGRAMMING PULSES OF A PROGRAM VOLTAGE FOLLOWED BY VERIFICATION PULSES OF A PLURALITY OF PROGRAM VERIFY VOLTAGES EACH ASSOCIATED WITH ONE OF THE PLURALITY OF DATA STATES TO SELECTED ONES OF THE PLURALITY OF WORD LINES TO PROGRAM AND VERIFY THE MEMORY CELLS CONNECTED THERETO DURING EACH OF A PLURALITY OF PROGRAM LOOPS OF A PROGRAM OPERATION, THE MEMORY CELLS ASSOCIATED WITH PREDETERMINED ONES OF THE PLURALITY OF DATA STATES NOT BEING VERIFIED UNTIL THE MEMORY CELLS ASSOICATED WITH SPECIFIC PRIOR ONES OF THE PLURALITY OF DATA STATES FINISH PRORAMMING TO DEFINE VERIFY WINDOWS RANGING BETWEEN EACH ONE OF THE SPECIFIC PRIOR ONES OF THE PLURALITY OF DATA STATES AND EACH ONE OF THE PREDETERMINED ONES ⟵ 1300

ADJUSTING AT LEAST ONE OF THE VERIFY WINDOWS IN RESPONSE TO THE MEMORY CELLS ASSOCIATED WITH ONE OF THE SPECIFIC PRIOR ONES OF THE PLURALITY OF DATA STATES NOT FINISHING PROGRAMMING BEFORE THE ONE OF THE PREDETERMINED ONES OF THE AT LEAST ON OF THE VERIFY WINDOWS IS VERIFIED ⟵ 1302

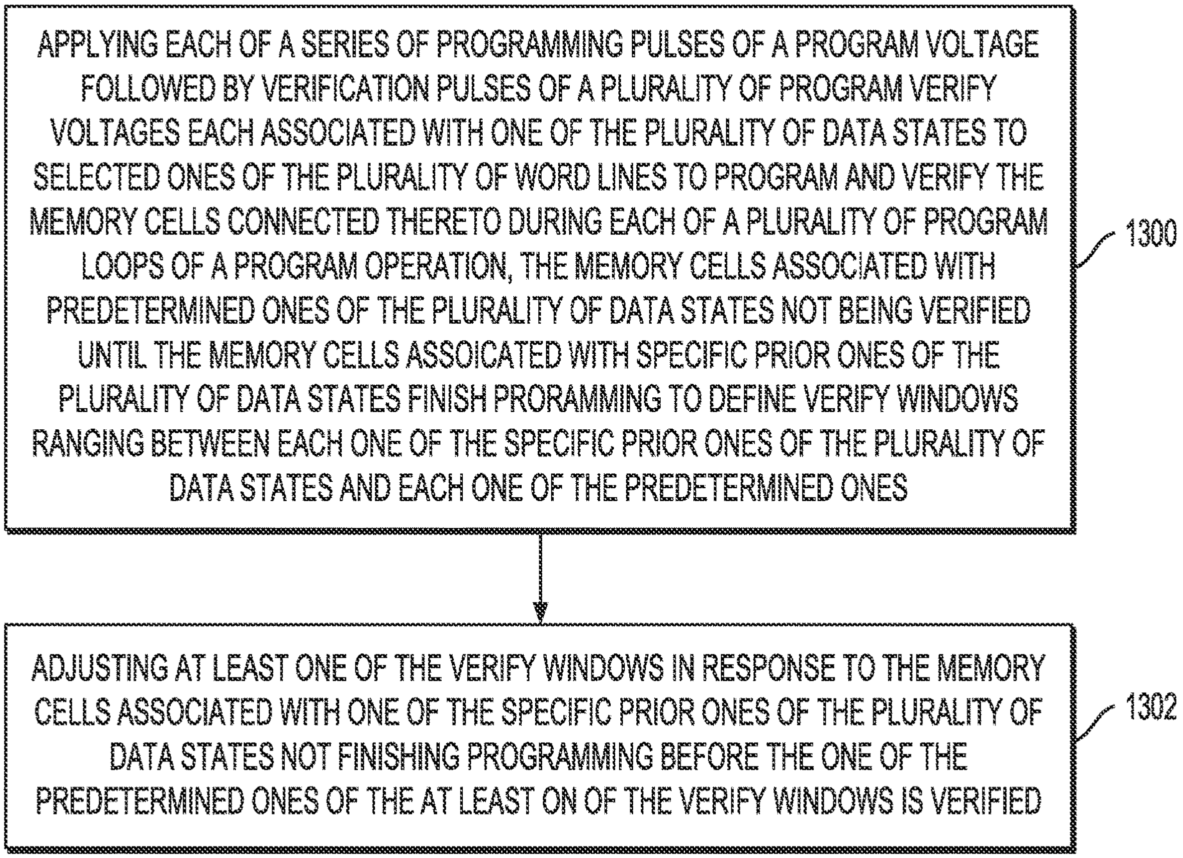

*FIG. 22*

ADVANCED WINDOW PROGRAM-VERIFY

FIELD

The present technology relates to the operation of memory devices.

BACKGROUND

Semiconductor memory devices or apparatuses are widely used in various electronic devices such as laptops, digital audio players, digital cameras, cellular phones, video game consoles, scientific instruments, industrial robots, medical electronics, solid state drives, automotive electronics, Internet of Things (IOT) devices and universal serial bus (USB) devices. Semiconductor memory includes both non-volatile and volatile memory. Non-volatile memory retains stored information without requiring an external power source. Examples of non-volatile memory include flash memory (e.g., NAND-type and NOR-type flash memory) and Electrically Erasable Programmable Read-Only Memory (EEPROM).

A memory apparatus can be coupled to one or more hosts, where one or more interfaces are used to access the memory apparatus. Additionally, the memory apparatus is often managed by a controller, where among several roles, the controller is configured to interface between the host and the memory apparatus.

To improve performance, some memory apparatuses utilize various techniques to limit when certain data states are verified during programming. However, while such techniques can provide reduced program time, some risk of over programming may result. Thus, there is a need for improved non-volatile memory apparatuses and methods of operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines and disposed in strings. The memory cells are configured to retain a threshold voltage corresponding to one of a plurality of data states. A control means is coupled to the plurality of word lines and the strings and is configured to apply each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation. The memory cells associated with predetermined ones of the plurality of data states are not verified until the memory cells associated with specific prior ones of the plurality of data states finish programming to define verify windows ranging between each one of the specific prior ones of the plurality of data states and each one of the predetermined ones. The control means also adjusts at least one of the verify windows in response to the memory cells associated with one of the specific prior ones of the plurality of data states not finishing programming before the one of the predetermined ones of the at least one of the verify windows is verified.

According to another aspect of the disclosure, a controller in communication with a memory apparatus including memory cells each connected to one of a plurality of word lines and disposed in strings is also provided. The memory cells are configured to retain a threshold voltage corresponding to one of a plurality of data states. The controller is configured to instruct the memory apparatus to apply each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation, the memory cells associated with predetermined ones of the plurality of data states not being verified until the memory cells associated with specific prior ones of the plurality of data states finish programming to define verify windows ranging between each one of the specific prior ones of the plurality of data states and each one of the predetermined ones. The controller is also configured to adjust at least one of the verify windows in response to the memory cells associated with one of the specific prior ones of the plurality of data states not finishing programming before the one of the predetermined ones of the at least one of the verify windows is verified.

According to an additional aspect of the disclosure, a method of operating a memory apparatus is provided. The memory apparatus includes memory cells each connected to one of a plurality of word lines and disposed in strings is also provided. The memory cells are configured to retain a threshold voltage corresponding to one of a plurality of data states. The method includes the step of applying each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation, the memory cells associated with predetermined ones of the plurality of data states not being verified until the memory cells associated with specific prior ones of the plurality of data states finish programming to define verify windows ranging between each one of the specific prior ones of the plurality of data states and each one of the predetermined ones. The method also includes the step of adjusting at least one of the verify windows in response to the memory cells associated with one of the specific prior ones of the plurality of data states not finishing programming before the one of the predetermined ones of the at least one of the verify windows is verified.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 12:
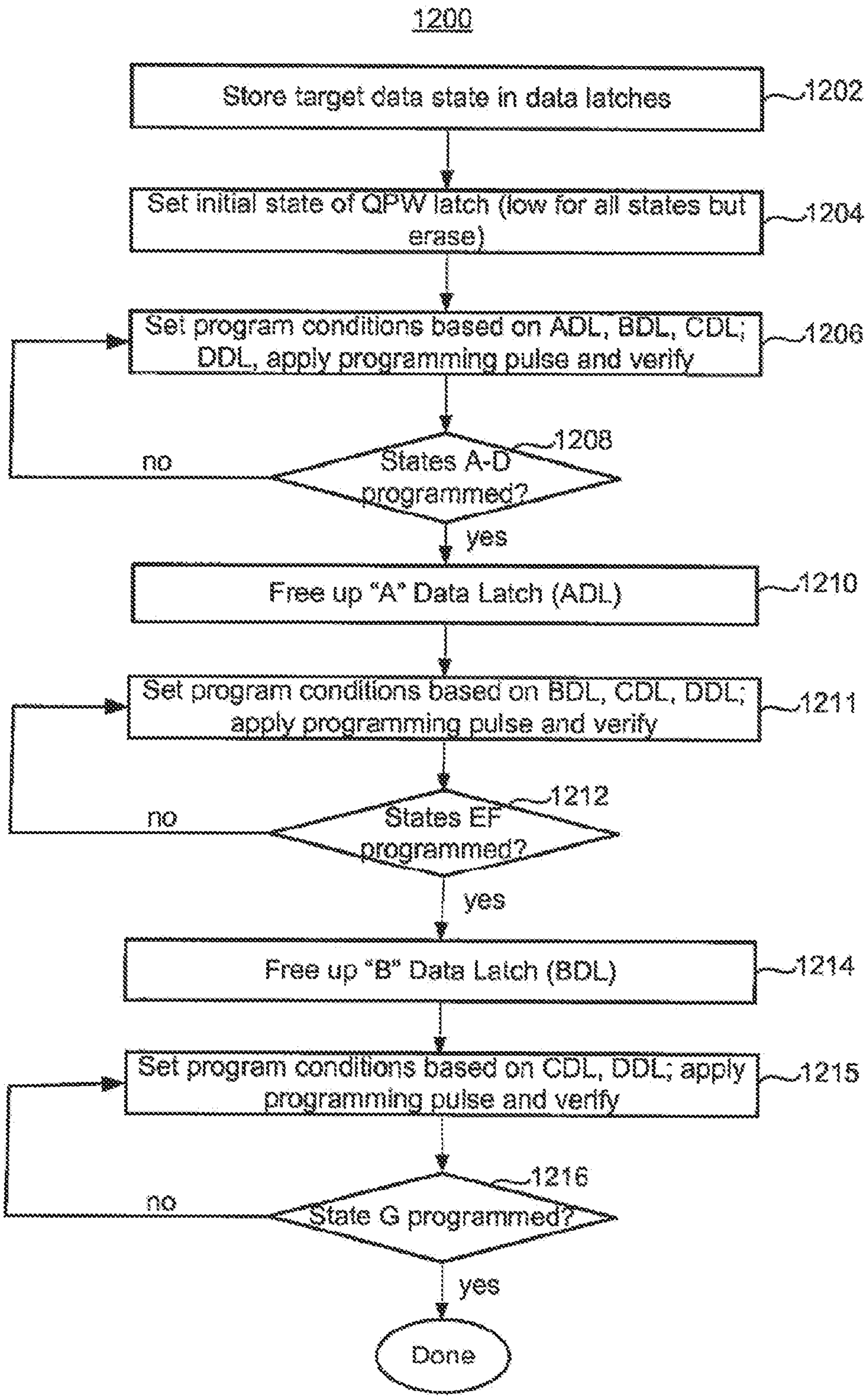
FIG. 12 is a flowchart of one embodiment of a process of operating data latches while programming and verifying non-volatile storage according to aspects of the disclosure.
Figure 14:
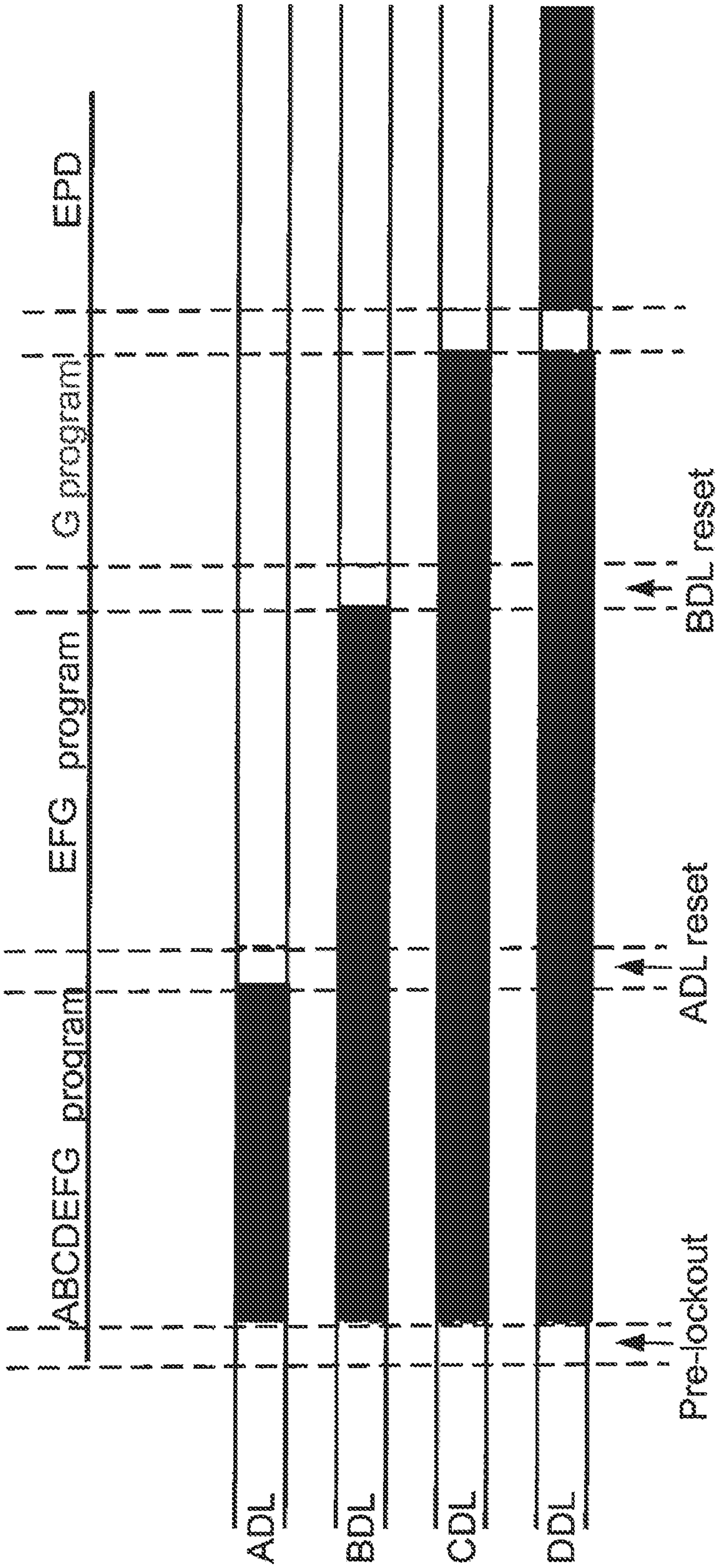
Figure 16:
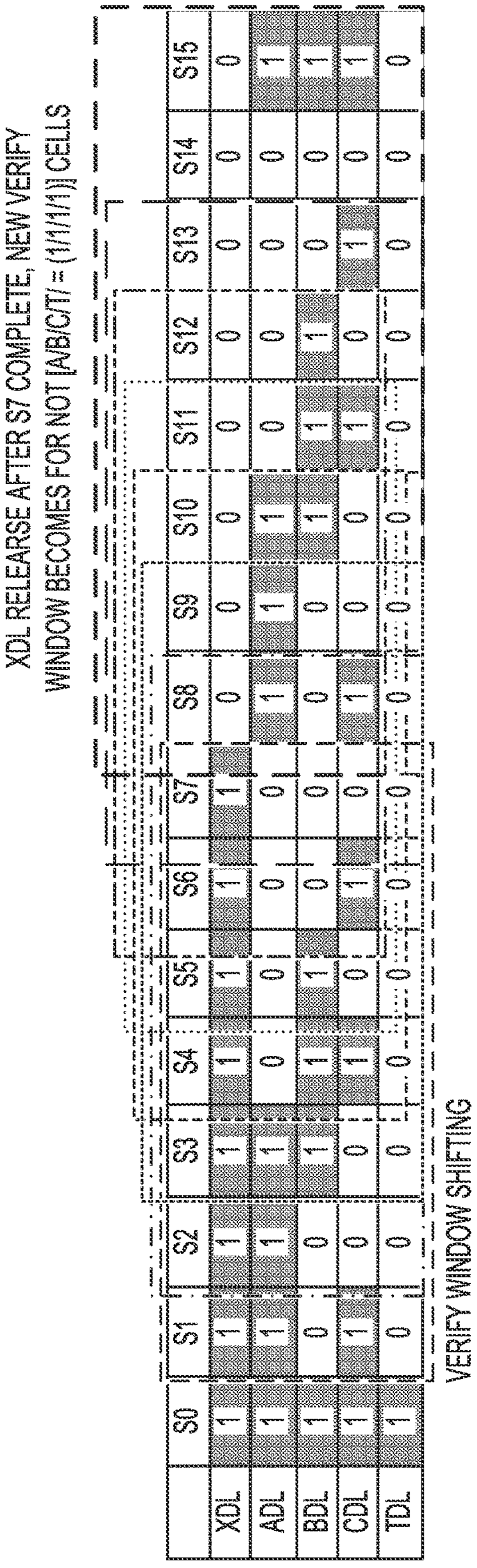

FIG. 13A, FIG. 13B, FIG. 13C, and FIG. 13D are tables that show status of data latches throughout various stages of the process of FIG. 12 according to aspects of the disclosure;

FIG. 14 shows latch usage during various stages of one embodiment of programming according to aspects of the disclosure;

FIG. 15 is a chart listing the program loop when each data state begins verify and when programming is complete for an example memory apparatus having quad-level memory cells according to aspects of the disclosure;

FIG. 16 shows verify windows as a program operation proceeds for the example memory apparatus having quad-level memory cells and employing window verify according to aspects of the disclosure;

FIG. 17 shows one of the verify windows for the example memory apparatus having quad-level memory cells and employing window verify to illustrate an over program issue according to aspects of the disclosure;

FIG. 18 shows an adjustment to the verify windows for an example memory apparatus having quad-level memory cells according to aspects of the disclosure;

FIGS. 19A and 19B show the contents of a first user data latch, a second user data latch, a third user data latch, a data transfer latch, a first data latch, and a second data latch or each of the plurality of data states and scan conditions for the example memory apparatus having quad-level memory cells employing the adjustment to the verify windows of FIG. 18 according to aspects of the disclosure;

FIG. 20 shows another adjustment to the verify windows for an example memory apparatus having quad-level memory cells according to aspects of the disclosure;

FIGS. 21A and 21B show the contents of the first user data latch, the second user data latch, the third user data latch, the data transfer latch, the first data latch, and the second data latch or each of the plurality of data states and scan conditions for the example memory apparatus having quad-level memory cells employing the adjustment to the verify windows of FIG. 20 according to aspects of the disclosure; and FIG. 22 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIGS. 5 and 6). In a four-bit per cell memory device, there are sixteen data states including the erased state and fifteen higher data states referred to as the Er or S0, S1, S2, S3, S4, S5, S6, S7, S8, S9, S10, S11, S12, S13, S14 and S15 data states.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. For example, in FIGS. 5 and 6, a memory cell which is to be programmed to the A data state can be subject to verify tests at VvA, a verify voltage of the A data state. In order to improve programming time, some later data states may not be verified until certain earlier data states finish programming. However, this can result in the later data states being over programmed.

Figure 1A:
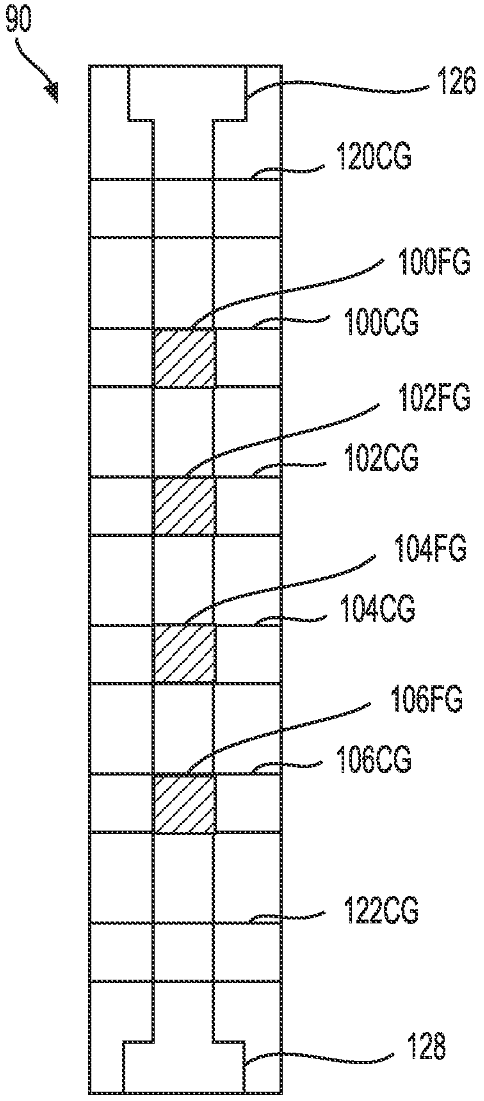
FIG. 1A is a top view of one embodiment of a NAND string according to aspects of the disclosure.
Figure 1B:
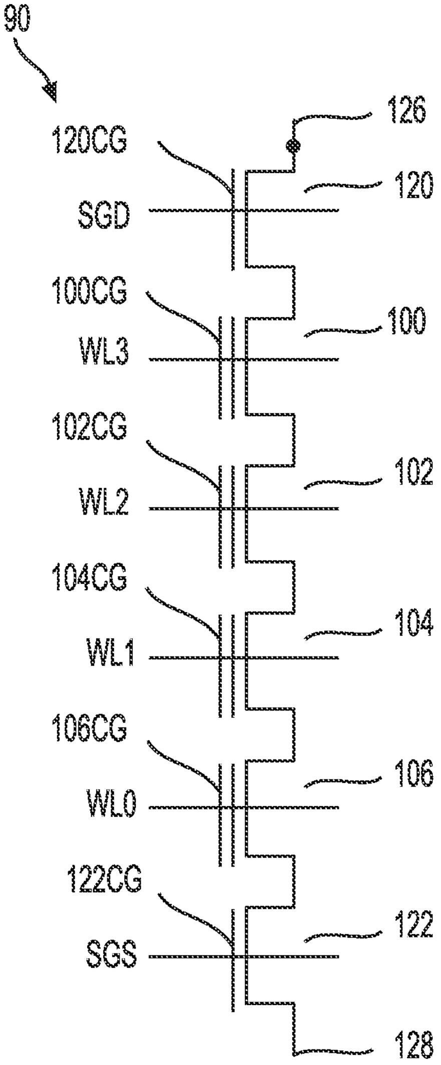
FIG. 1B is an equivalent circuit diagram of the NAND string according to aspects of the disclosure.

FIG. 1A is a top view showing one NAND string 90. FIG. 1B is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively. Other types of non-volatile memory in addition to NAND flash memory can also be used.

Figure 2:
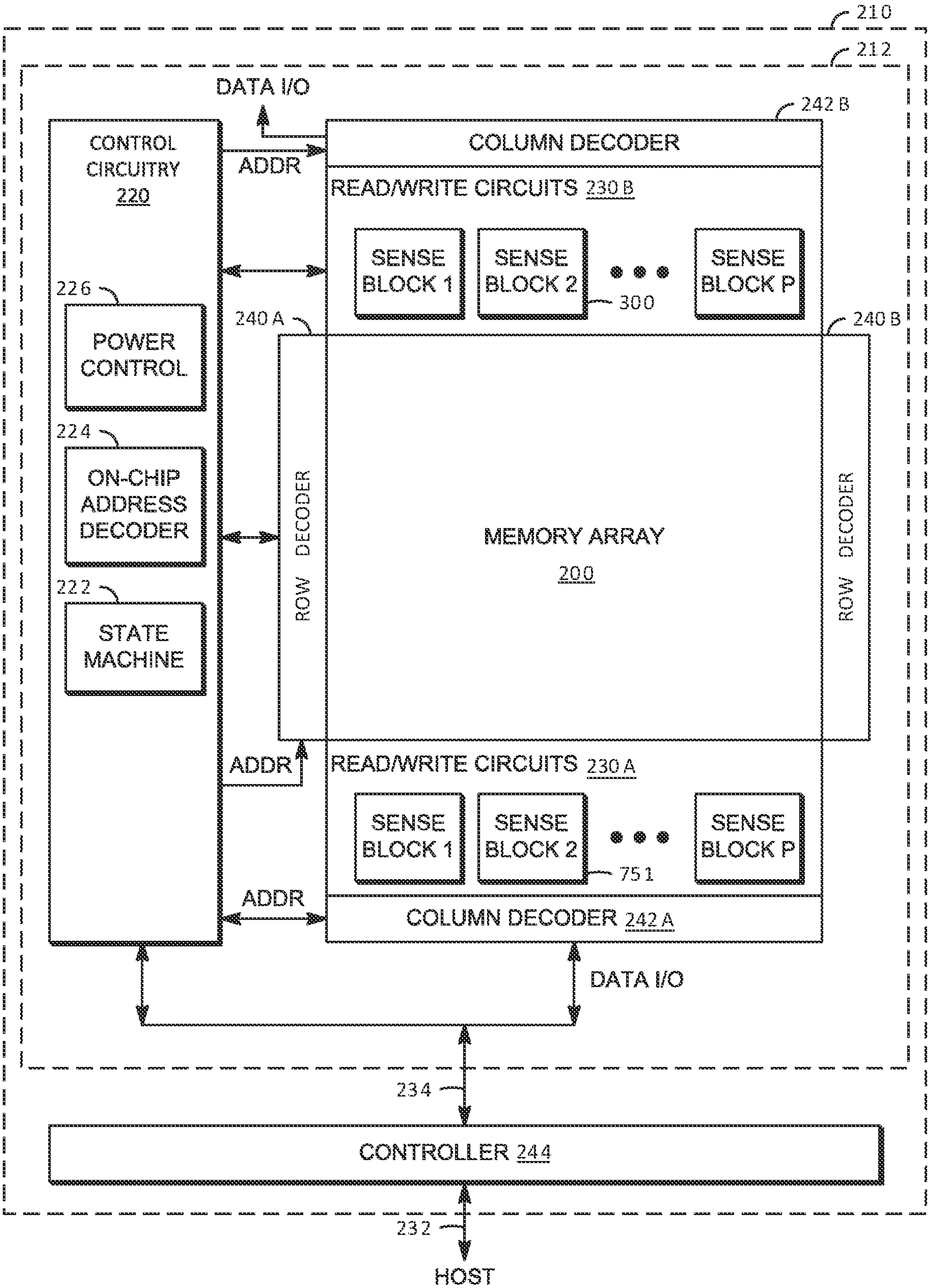
FIG. 2 illustrates a non-volatile storage device that may include one or more memory die or chips according to aspects of the disclosure.

FIG. 2 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
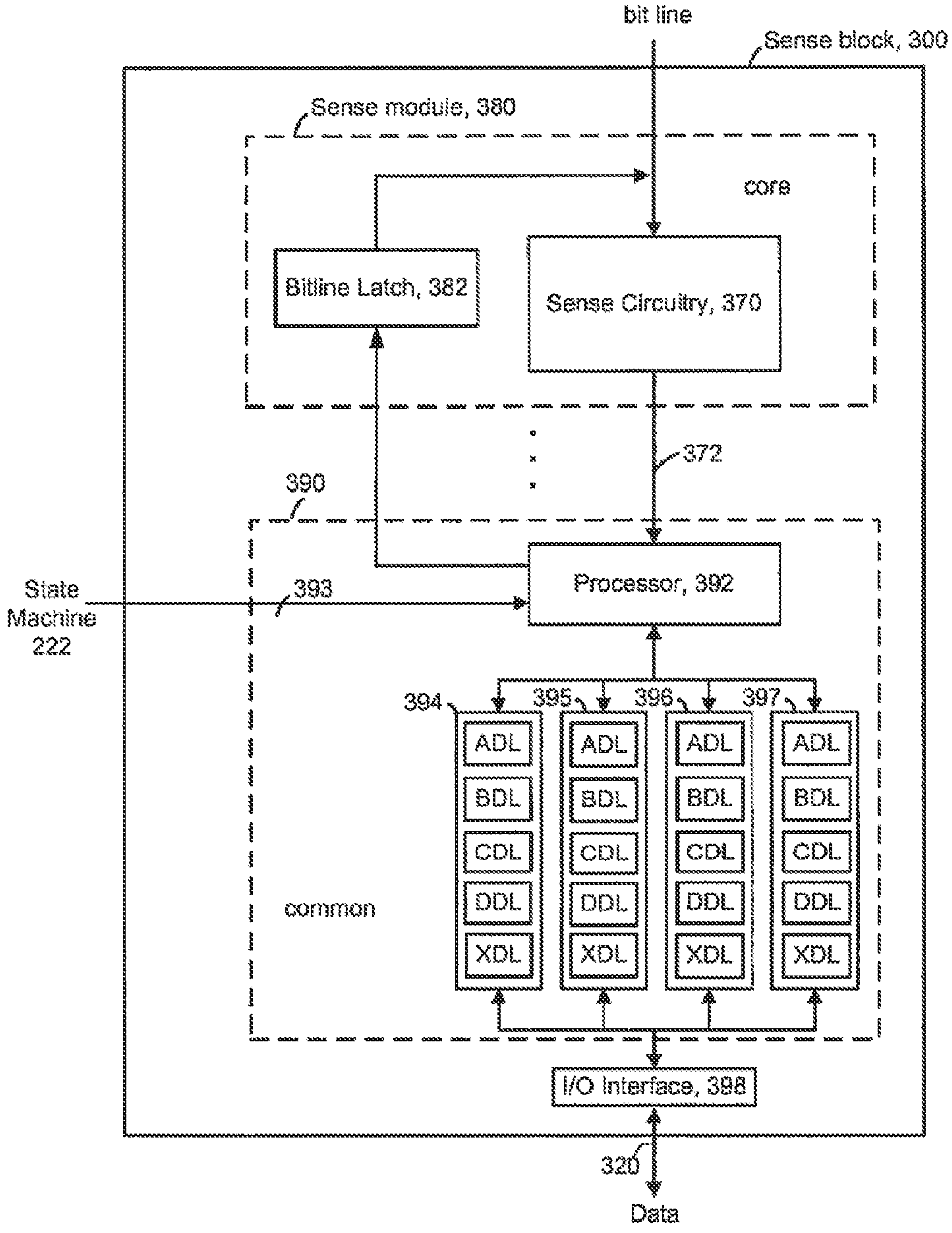
FIG. 3 is a block diagram depicting one embodiment of a sense block according to aspects of the disclosure.

FIG. 3 is a block diagram depicting one embodiment of a sense block 300. An individual sense block 300 is partitioned into a core portion, referred to as a sense module 380, and a common portion 390. In one embodiment, there is a separate sense module 380 for each bit line and one common portion 390 for a set of multiple sense modules 380. In one example, a sense block 300 will include one common portion 390 and eight sense modules 380. Each of the sense modules in a group will communicate with the associated common portion via a data bus 372.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., 1.5-3 V). As an example, a flag=0 can inhibit programming, while flag=1 does not inhibit programming.

Common portion 390 comprises a processor 392, five example sets of data latches 394 and an I/O Interface 398 coupled between the sets of data latches 394 and data bus 320. One set of data latches can be provide for each sense module, and five data latches identified by ADL, BDL, CDL, DDL, XDL may be provided for each set. The use of the data latches is further discussed below.

Processor 392 performs computations. For example, one of its functions is to determine the data stored in the sensed storage element and store the determined data in the set of data latches. At least some of the data latches in a set of data latches (e.g., 394) are used to store data bits determined by processor 392 during a read operation. At least some of the data latches in a set of data latches are also used to store data bits imported from the data bus 320 during a program operation. The imported data bits represent write data meant to be programmed into the memory. I/O interface 398 provides an interface between data latches 394-397 and the data bus 320.

In one embodiment, a user is able to stream data to be programmed into a storage element into the XDL latch. This program data may be transferred to the ADL, BDL, and CDL latches at the beginning of the program operation. Note this describes programming three bits per memory cell. In one embodiment, during a read operation, the ADL, BDL and CDL latch are used to store the three bits that are read from the memory cell. The user is able to toggle the read data out through the XDL latch in one embodiment.

In one embodiment, the user has access to the XDL latch, but not to the ADL, BDL, or CDL latches. For example, the user may be able to access the XDL latch to perform background caching during a program operation. Background caching is discussed in more detail below. In one embodiment, the user has limited access to the XDL during a program operation. For example, the user may be able to stream program data into the XDL latch prior to the programming operation. However, the user may not have access to the XDL latch during one embodiment of programming. In one embodiment, the XDL latch is used to store “lockout data” for the memory cell during a program operation. Briefly, the lockout data may indicate that a storage element is locked out from further programming. Further details are discussed below.

During reading or other sensing, the state machine 222 controls the supply of different control gate voltages to the addressed storage element. As it steps through the various control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches (e.g., 394). In another embodiment of the core portion, bit line latch 382 serves both as a latch for latching the output of the sense module 380 and as a bit line latch as described above.

Some implementations can include multiple processors 392. In one embodiment, each processor 392 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394-397 from the data bus 320. The program operation, under the control of the state machine, comprises a series of programming voltage pulses applied to the control gates of the addressed storage elements. Each program pulse is followed by a read back (verify) to determine if the storage element has been programmed to the desired memory state. Processor 392 monitors the read back memory state relative to the desired memory state. When the two are in agreement, the processor 392 sets the bit line latch 382 so as to cause the bit line to be pulled to a state designating program inhibit. This inhibits the storage element coupled to the bit line from further programming even if program pulses appear on its control gate. In other embodiments, the processor initially loads the bit line latch 382 and the sense circuitry sets it to an inhibit value during the verify process.

Each set of data latch stacks 394-397 contains a stack of data latches corresponding to the sense module 380, in one embodiment. In one embodiment, there are five data latches per sense module 380. The ADL, BDL, and CDL data latches can be implemented as a shift register so that the parallel data stored therein is converted to serial data in the XDL latch for transfer across data bus 320, and vice-versa. All the ADL, BDL, and CDL data latches corresponding to the read/write block of m storage elements can be linked together to form a block shift register so that a block of data can be input or output by serial transfer. In particular, the bank of read/write modules may be adapted so that each of its set of ADL, BDL, and CDL data latches will shift data in to or out of the XDL latch in sequence as if they are part of a shift register for the entire read/write block.

In one embodiment, one purpose of the ADL, BDL, and CDL latches is to store data that is to be programmed into a storage element. For example, the storage elements may store three bits per storage element. In one embodiment, the storage elements store four bits per storage element. In this case, there may be an additional data latch (not depicted in FIG. 3) for storing the fourth bit of data that is to be programmed into a storage element. In one embodiment, the storage elements store only two bits per storage element, in which case one of the ADL, BDL, and CDL latches is not needed. The storage elements could store more than four bits per storage element, in which case there may be one data latch for each bit.

In one embodiment, the ADL, BDL, and CDL latches may also be used to store status information during programming. For example, after the storage element has reached its target threshold voltage, each latch (ADL, BDL, CDL) could be set to "1" to indicate that programming is complete for this storage element. In one embodiment, the latches are used differently as programming proceeds to different stages. In one embodiment, the ADL latch is freed up during programming. In one embodiment, the BDL latch is also freed up during programming. Further details are discussed in connection with FIGS. 12, 13A-13D, and 14, and elsewhere.

In one embodiment, the DDL latch is used to store status information during programming. In one embodiment, programming is slowed as the storage element nears the target threshold level. For example, the DDL latch may identify that a storage element's Vth is above a lower verify level (e.g., VvaL or VvbL in FIG. 5). If that storage element is not yet locked out, then it may receive slower programming. If the DDL latch indicates the storage element's Vth is below the lower verify level, then it may be in a fast programming mode. Further details are discussed below.

In one embodiment, the XDL latch is used to store status information during programming. After the data from the XDL latch has been shifted in to the ADL, BDL, and CDL data latches, the XDL latch may be set to an initial state (e.g., "0"). After a memory cell has reached its target threshold voltage, the XDL latch may be set to another state (e.g., "1"). Thus, the XDL latch may store "lockout status." Therefore, the program data in the ADL, BDL, and CDL latches may be preserved both during and after the program operation. Further details are discussed below.

Figure 4:
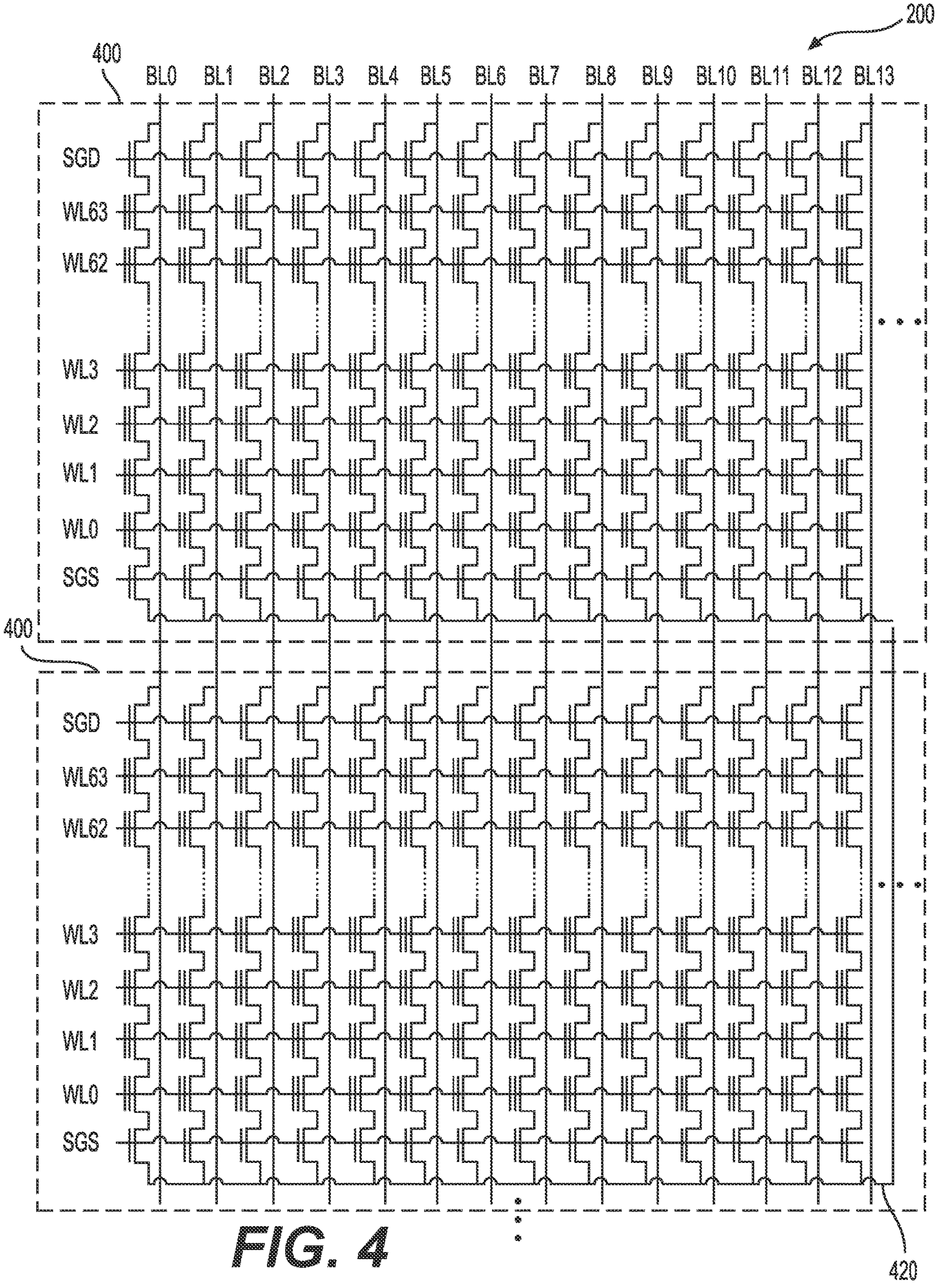
FIG. 4 depicts blocks of NAND flash memory cells in the memory array of FIG. 2 according to aspects of the disclosure.

FIG. 4 depicts blocks of NAND flash memory cells in the memory array 200 of FIG. 2. The memory array can include many blocks 400. Two example blocks 400 are depicted in FIG. 4. Each block 400 includes a number of NAND strings. A set of bit lines, e.g., BL0, BL1, . . . may be shared among the blocks. Thus, each NAND string is associated with one bit line. Each NAND string is connected at one end to a drain select gate (SGD), and the control gates of the drain select gates are connected via a common SGD line. The NAND strings are connected at their other end to a source select gate which, in turn, is connected to a common source line 420. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Note that there may be thousands, or tens of thousands of bit lines. Therefore, a single word line may be used by tens of thousands of storage elements. Typically, there is a driver at one and of the word line that provides the read reference voltages or the programming voltages.

Figure 5:
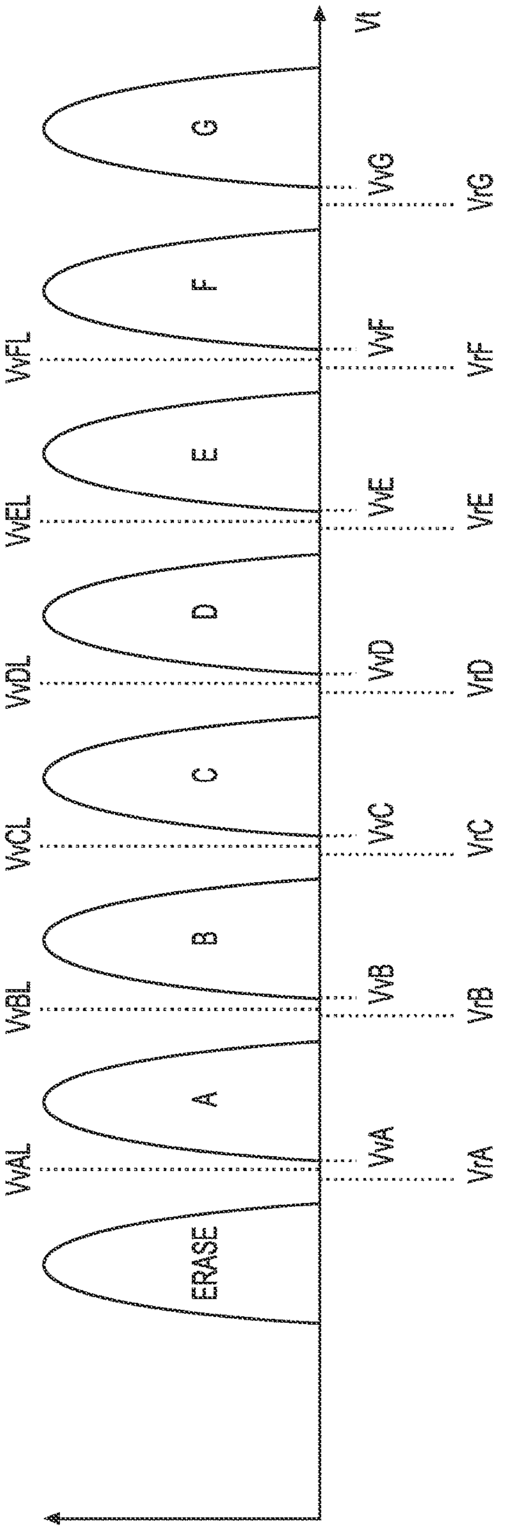
FIG. 5 depicts an example set of threshold voltage distributions for an eight-state memory device in which each storage element stores three bits of data according to aspects of the disclosure.

FIG. 5 depicts an example set of threshold voltage distributions for an eight-state memory device in which each storage element stores three bits of data. A first threshold voltage (Vth) distribution is provided for erased (Er-state) storage elements. Seven Vth distributions represent programmed states A through G. In one embodiment, the threshold voltages in the Er-state are negative and the threshold voltages in the A-G distributions are positive. However, all or a part of the threshold distribution in the Er-state may be positive. Also, all or a part of the threshold distribution of the A-state may be negative (likewise for other data states).

Read reference voltages, Vra, Vrb, Vrc, etc. are also provided for reading data from storage elements. By testing whether the threshold voltage of a given storage element is above or below Vra, Vrb Vrc, etc. the system can determine the state, e.g., programming condition, the storage element is in.

Further, verify reference voltages, Vva, Vvb Vvc, etc. are provided. When programming storage elements to the A-state, B-state, C-state, etc. the system will test whether those storage elements have a threshold voltage greater than or equal to Vva, Vvb Vvc, etc.

In one embodiment, known as full sequence programming, storage elements can be programmed from the Er-state directly to any of the programmed states A-G. For example, a population of storage elements to be programmed may first be erased so that all storage elements in the population are in the Er-state. A series of program pulses will then be used to program storage elements into their respective target states A-G. While some storage elements are being programmed from the Er-state to the A-state, other storage elements are being programmed from the Er-state to the B-state, etc.

FIG. 5 also shows verify low reference voltages VvAL, VvBL, VvCL, etc. These reference voltages may be used during a program verify operation to determine whether a storage element is near its intended target threshold. If so, then programming speed may slow down. In one embodiment, Vdd is applied to bit lines that have reached their target state and are inhibited from further programming. Bit lines of storage elements that are still below the verify low level may be grounded to allow for fast programming. However, when between the verify low level and the normal verify level, the bit line may receive an intermediate voltage (e.g., between ground and Vdd) to cause slow or moderate speed programming. As one example, the intermediate voltage could be about 0.6V to 0.8V. However, the intermediate voltage could be either below or above this range. In one embodiment, the DDL latch indicates where the storage element is in this programming sequence. Further details are discussed below. In one embodiment, storage elements being programmed to the G-state do not receive the slow (or moderate) speed programming. Hence, no verify low reference voltage is depicted in FIG. 5 for the G-state. However, there may be a VvGL for the G-state, if desired.

In one embodiment, multiple passes may be used to program the storage elements. For example, one pass may be used to program each bit. Thus, in the case of storing three bits per memory cell, there may be three passes. In the case of storing two bits per memory cell, there may be two passes. In one embodiment, a multi-state storage element stores data for three different pages: a lower page, a middle page, and an upper page. The eight states, and the bits they represent, may be: Er-state (111), A-state (011), B-state (101), C-state (001), D-state (110), E-state (010), F-state (100), and G-state (000). For Er-state, all pages store a "1." For A-state, the lower page stores a "0", the middle page stores a "1" the upper page stores a "1." Other states can be deduced in a similar manner. Note that although specific bit patterns have been assigned to each of the states, different bit patterns may also be assigned. Also note that this bit and page assignment may be used for other programming sequences, such as the fast/slow programming described above.

In the first programming pass of one embodiment, the lower page is programmed for a selected word line WLn. If the lower page is to remain data 1, then the storage element state remains at the Erased state. If the data is to be programmed to 0, then the threshold voltage of the storage elements on WLn are raised such that the storage element is programmed to an intermediate state. This intermediate state could have a lower tail just below VvD. In the second programming pass of one embodiment, the middle page is programmed for a selected word line WLn. This results in the creation of two more threshold voltage distributions (one additional from each of the former distributions). In the third programming pass of one embodiment, the upper page is programmed for a selected word line WLn. This results in the creation of four more threshold voltage distributions (one additional from each of the former four distributions).

Although the programming examples depict eight data states and three pages of data, the concepts taught can be applied to other implementations with more or fewer than eight states and more or fewer than three pages. Moreover, in the example programming techniques discussed, the Vth of a storage element is raised gradually as it is programmed to a target data state. However, programming techniques can be used in which the Vth of a storage element is lowered gradually as it is programmed to a target data state. Programming techniques which measure storage element current can be used as well. The concepts herein can be adapted to the different programming techniques.

Figure 6:
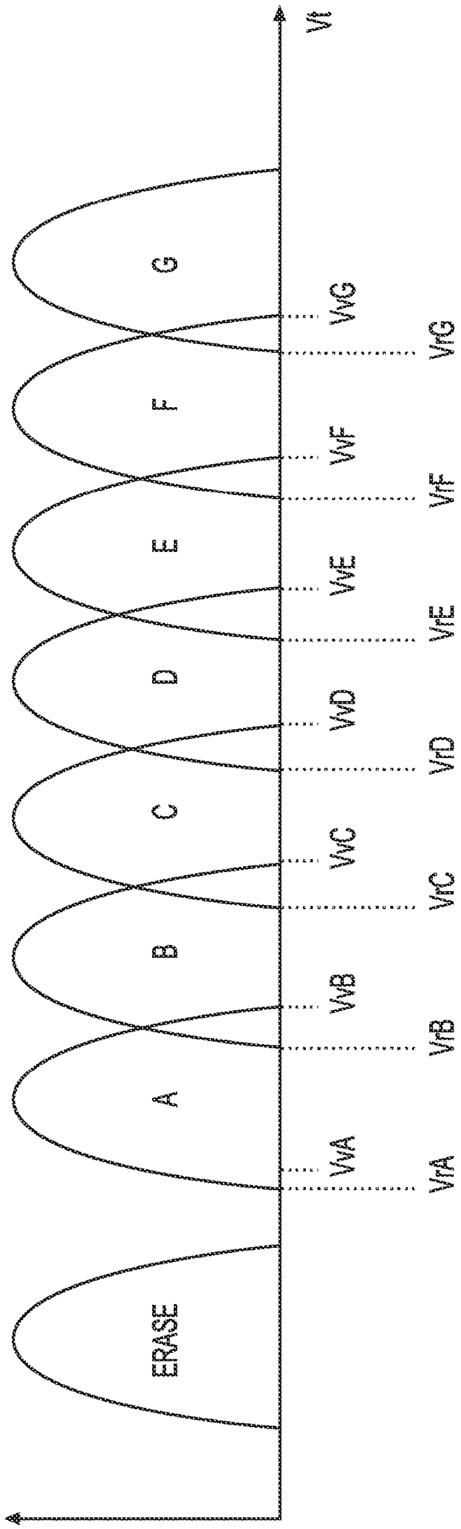
FIG. 6 illustrates that Vt distributions can partially overlap according to aspects of the disclosure.

FIG. 6 illustrates that Vt distributions can partially overlap since the error correction algorithm can handle a certain percentage of cells that are in error. Note that in some embodiments, at one point in time the threshold voltage distribution may resemble FIG. 5 and at another time the threshold voltage distributions may overlap, as in FIG. 6. For example, just after programming, the threshold voltage distribution may resemble FIG. 5. However, over time, the threshold voltages of memory cells may shift, such that there may be overlap.

However, there may be overlap between at least some neighboring threshold distributions immediately after programming. Note that it can be very difficult to detect word line defects when there is overlap between neighboring Vt thresholds.

Also note that contrary to the equal spacing/width of the depicted threshold voltage distributions, various distributions may have different widths/spacings in order to accommodate varying amounts of susceptibility to data retention loss.

Figure 7:
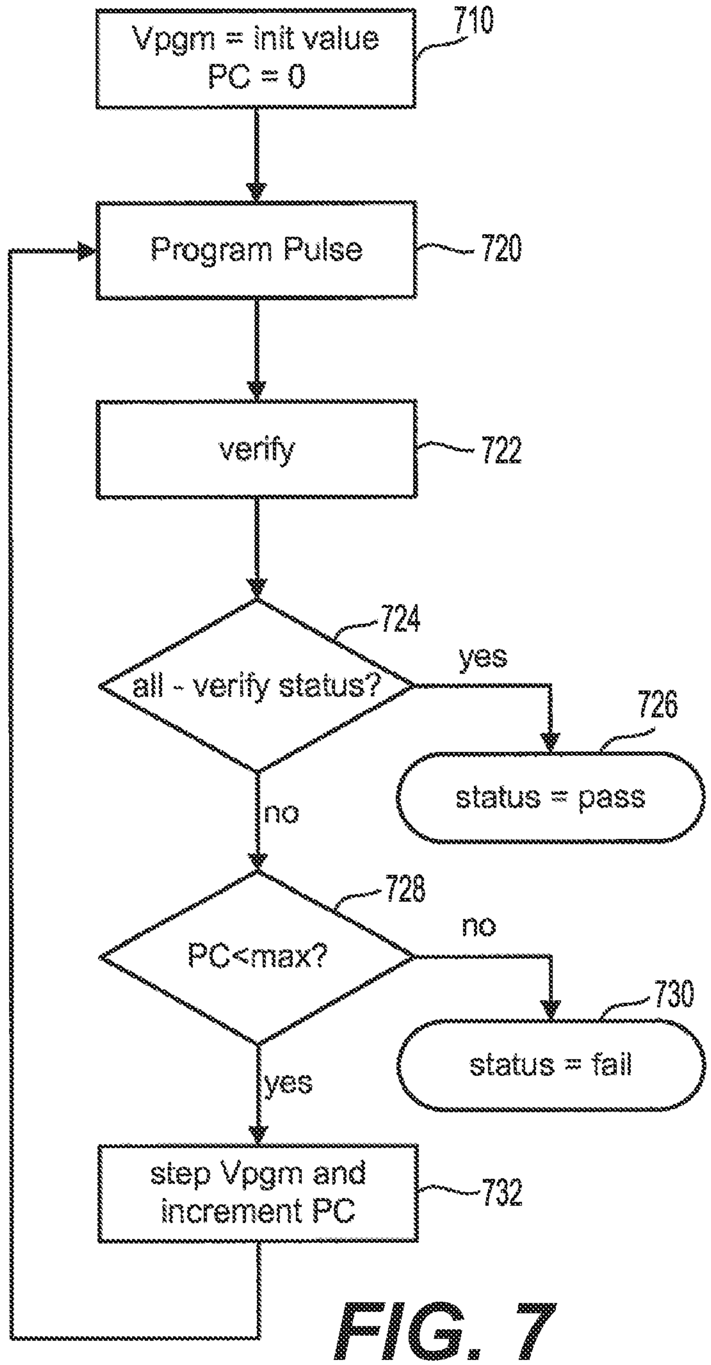
FIG. 7 is a flowchart describing one embodiment of a programming process, which includes one or more verification steps according to aspects of the disclosure.

FIG. 7 is a flowchart describing one embodiment of a programming process, which includes one or more verification steps. In step 810, the program voltage (Vpgm) is set to an initial value. Also, in step 710, a program counter (PC) is initialized to zero. In step 720, a program pulse is applied.

In step 722, a verification process is performed. In one embodiment, the verification is a concurrent coarse/fine verify. Referring to FIG. 5, some memory cells that are being programmed to the A-state are verified for the VvaL level, while others that are being programmed to the A-state are verified for the Vva level. During the initial programming steps in which the memory cell's threshold is well below the final level (Vva), course programming is applied. However, after the memory cell's threshold voltage reaches VvaL, fine programming is used. Thus, while some memory cells are being verified for coarse programming, other memory cells are being verified for fine programming. Note that with course/fine programming, some memory cells are being verified for one state (e.g., A-state), while others are being verified for another state (e.g., B-state). Note that when a particular memory cell has been verified as being programmed to its intended state, it may be locked out from further programming.

However, note that if there is a break on the selected word line being programmed, then the verification may produce an erroneous result. As noted above, a break in the word line could result in storage elements on the far side of the break receiving a reference voltage that is smaller than intended. For example, storage elements that are intended to be programmed to the G-state should receive the reference voltage VvG (see FIG. 5) at their control gate. However, they may in fact receive a lower voltage due to the break. Under normal circumstances, if a storage element has not yet reached its target state (e.g., its actual Vt is below the reference voltage), the storage element will turn on in response to the verify voltage. On the other hand, if a storage element has reached its target state (e.g., its actual Vt is at or above the reference voltage) it should not turn on. For example, consider the case of a storage element being targeted for the G-state. This storage element will be verified by applying VvG to the selected word line. If its actual Vt is below VvG it will conduct a current. After its actual Vt is above VvG it will no longer turn on, indicating it has reached its target state.

However, since storage elements beyond the break receive too low of a verify voltage, they may fail to turn on when their actual Vt is below the target Vt. A storage element past the break might see a lower verify voltage than intended. For example, a storage element that is targeted for the G-state might should see a verify voltage of VvG, but might experience a lower voltage at its control gate. As one particular example, the storage example might only see a verify voltage of VvF, if it is past the break. Therefore, in this particular example, when its actual Vt is greater than VvF it will pass the verify test. In general, the storage element past the break could pass the verify test if its actual threshold voltage is below VvG. Therefore, programming will stop for that storage element. However, it may in fact be under-programmed.

In step 724, it is determined whether all of the memory cells have verified that their threshold voltages are at the final target voltage for that memory cell. If so, the programming process is completed successfully (status=pass) in step 726. If all of the memory cells are not all verified, then it is determined whether the program counter (PC) is less than a maximum value such as 20. If the program counter (PC) is not less than max (step 728), then the program process has failed (step 730). If the program counter (PC) is less than a maximum value (e.g., 20), then the program counter (PC) is incremented by 1 and the program voltage is stepped up to the next pulse in step 832. Subsequent to step 732, the process loops back to step 720 and the next program pulse is applied to the memory cells.

Figure 8:
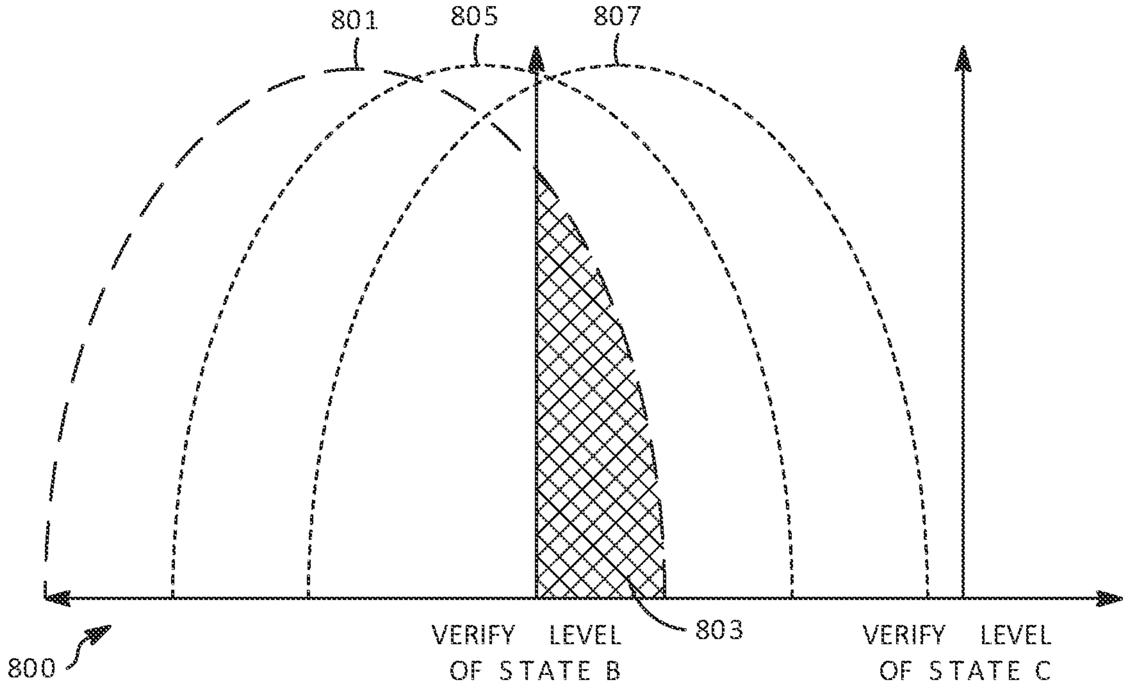
FIG. 8 illustrates a program verify operation according to aspects of the disclosure.

FIG. 8 shows a diagram 800 with a threshold voltage (Vt) distribution during the middle of program operation and verifying a first memory state, here shown as the State B, and a second memory state, here state C. While the states B and C are used to illustrate the present concept, it will be recognized that the other consecutive states can also use similar principals. Voltage is represented on the abscissa.

In NAND memory, the logical value stored in a memory cell is determined by the voltage window in which the cell's Vt lies. The Vt is the voltage stored in a cell after the program pulse. As cell size is scaled down and more bits per cell are stored, the threshold voltage window used to represent each value becomes smaller, leading to increased error rates in determining a cell's value. This is because process variations become more prevalent when the amount of charge stored in a flash cell reduces with feature size, leading to the Vt of different cells storing the same value becoming significantly different. Hence, deciding what logical value to which a cell's threshold voltage corresponds is becoming increasingly difficult while it is necessary for reliability.

After respective program pulses are applied to the memory cells, the operation of the memory performs a verification step which can detect the distribution of the voltages stored in the memory cells. Each memory state (e.g., A-G states) has its own Vt, which increases with each successive state. The Vt distribution 801 results from a first program pulse being applied to the memory cells and shows the bitscan count of the number of memory cells as function of voltage. An upper tail of the distribution 801 includes some scanned bits (memory cells) that exceed the voltage verify level of State B. This is represented in area 803 to the right of the voltage verify level of State B. If the bitscan count in area 803 does not exceed a threshold value, then the memory system will apply the next program pulse, which will result in the distribution 805. If the bitscan count in area 803 meets or exceeds a threshold value, then the memory system will trigger the program verify pulse for C state, which results in bit scan distribution 805. No prior program verify have been applied for C state before triggering, which saves several program verify count and be known as smart skip program verify. This subsequent program pulse and verify will result in the distribution 807 beyond distribution 805 (at a higher voltage). In an example embodiment, when a Vt distribution at certain memory cell state, e.g., any of A through F states, then the verify process can trigger the verify for next voltage level in the same verify process without triggering the next program pulse. In an example embodiment, the verify process counts bits to the right of the Vt of state B and triggers the verify for C state occurs in the same verify loop as the sensing of the bits that exceed the Vt of the B state.

During a program verify operation in the memory, an example embodiment typically performs a program verify of all states, e.g., A-G states, along a set scheme. See, e.g., FIG. 10A of U.S. Pat. No. 10,014,063, which is hereby incorporated by reference in its entirety. In some practical applications, performing verify of the C to G states after a first program pulse can be a waste of time and resources. Therefore, smart skip program verify detects when an upper tail of a lower state (e.g., A or B state) is above some threshold value and triggers the program verify for the next higher state prior to starting a next program/verify loop. This can reduce unnecessary program/verify loop for the higher state at subsequent program loop. In order to trigger the next state verify, there is a pre-defined bit count in the memory circuitry and during the program operation, when the bit scan result shows that upper tail has a higher bit count compared to a stored threshold value (or reaches the threshold value), the methodology triggers the next state verify after next program pulse.

The smart skip program verify operation detects the upper tail of "n" state and determines if triggering n+1 state verify based on the threshold value. The threshold value can be set based on statistical analysis of the memory device. If is desirable to determine when to skip to the next state (n+1) from the current state (n) being verified as even using the minimum voltage increase of the programing voltage, the earliest program verify initiates on the next loop (n+1 loop) instead of the current loop (n) can result in an over programming.

Figure 9A:
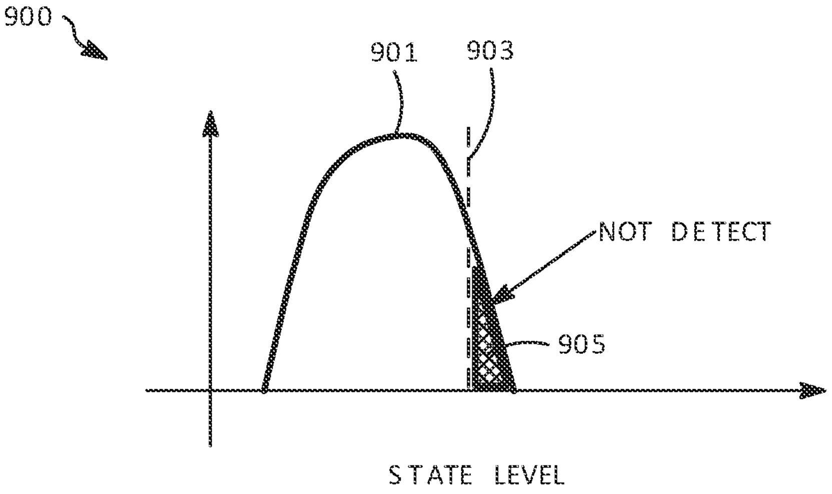
FIG. 9A illustrates a program verify operation that does not detect a bitcount above a threshold according to aspects of the disclosure.

FIG. 9A shows a diagram 900 that includes a threshold voltage distribution 901, i.e., bitscan counts, from a verify operation. This is used to verify the programmed bit values stored in the addressed memory cells at the state verify level 903. The area 905 to the right of the voltage level and under the curve of the verify pulse 901 (its upper tail) is the count of bitscans (i.e., the count of memory cells whose voltage exceeds the state voltage level). The area 905 does not show enough count to exceed the threshold value to trigger a skip to the next state level in the same verify iteration.

Figure 9B:
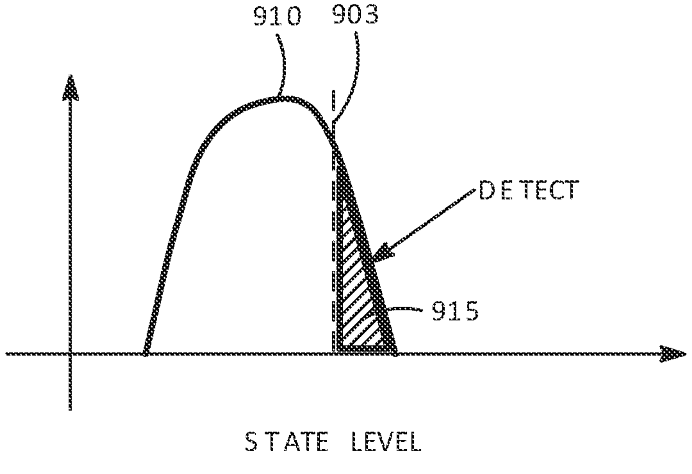
FIG. 9B illustrates a program verify operation that detect a bitcount above a threshold according to aspects of the disclosure.

FIG. 9B shows a diagram that includes threshold voltage distribution 910, i.e., bitscan counts, from a verify operation. This is used to verify the programmed bit values stored in the addressed memory cells at the state level 903. The area 915 to the right of the voltage level and under the curve of the verify pulse 910 (e.g., the upper tail of distribution 910) is the count of bitscans (i.e., the number of memory cells whose voltage exceeds the state voltage level). The area 905 does show enough count to exceed the threshold value and trigger a program verify to the next state level in the same verify iteration. In an example embodiment, the methodology, will trigger a verify before applying the next program pulse.

Figure 10A:
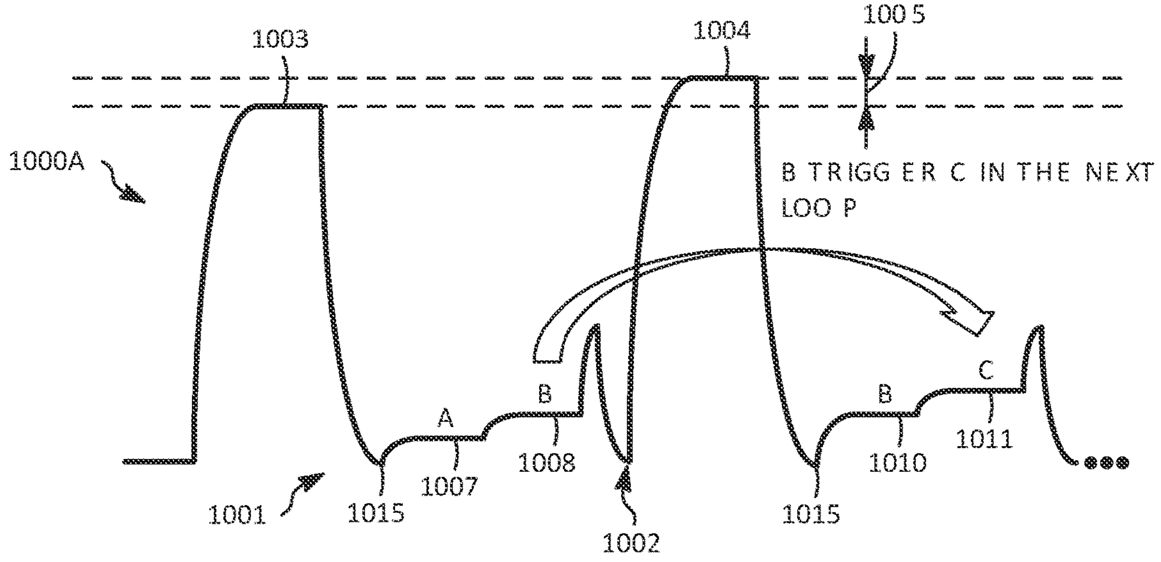
FIG. 10A illustrates a voltage levels in program verify iterations according to aspects of the disclosure.

FIG. 10A shows a program verify operation 1000A with two program verify iterations. The operation 1000A is a partial example of a memory cell programming operation for a multi-state memory device having an erased state (Er) and three programmed memory states (e.g., A, B, C). The horizontal axis depicts time. The vertical axis depicts control gate or word line voltage. Generally, a programming operation can involve applying a pulse train to a selected word line, where the pulse train includes multiple program loops or program-verify iterations. The program portion of the program-verify iteration includes a Vpgm pulse (voltage pulses 1003 or 1004), and the verify portion of the program-verify iteration includes one or more verify pulses (e.g., voltage pulses 1007, 1008 or voltage pulses 1010, 1011).

For each Vpgm pulse 1003, 1004, a square waveform is depicted for simplicity, although other shapes are possible such as a multilevel shape or a ramped shape. Further, Incremental Step Pulse Programming (ISPP) is used in this example, in which the Vpgm pulse amplitude steps up in each successive program loop shown as the voltage increase 1005. This example uses ISPP in a single programming pass in which the programming is completed. ISPP also can be used in each programming pass of a multi-pass operation.

A pulse train typically includes Vpgm pulses which increase stepwise in amplitude by in each program-verify iteration using a fixed or varying step size, e.g., voltage step 1005. A new pulse train starts at an initial Vpgm pulse level (for e.g., for an A level) and ends at a final Vpgm pulse level (e.g., at a G level for a three bits multi-level memory) which does not exceed a maximum allowed level.

Operation 1000A includes a series of Vpgm pulses 1003, 1004 that are applied to a word line selected for programming, and an associated set of non-volatile memory cells. One, two or three verify voltage pulses are provided after each Vpgm pulse as an example, based on the target memory states which are being verified. A voltage of 0V (here shown at 1015) may be applied to the selected word line between the Vpgm pulses 1003, 1004 and verify voltage pulses 1007, 1008 and 1010, 1011.

In an embodiment, A-state verify voltage VvA (e.g., waveform or signal 1007) may be applied after the first Vpgm pulse 1003. The B-state verify voltage VvB (e.g., waveform or signal 1008) may be applied after the waveform 1007. The bitscan occurs to count the number of memory cells that exceed the B-state level. This is the operation shown and described with reference to FIG. 9B. As the bitscan count exceeds a threshold value, the memory controller triggers the operation 1000A in the next iteration 1002 to trigger the C-state level verify signal 1001.

The next iteration 1002 increases the Vpgm pulse 1004 by voltage 1005 from the first program pulse 1003. The signal level is dropped to about zero volts and then the B-state and C-state program verify pulses 1010, 1011 are applied. B-state verify voltage VvB (e.g., waveform or signal 1010) may be applied after the second Vpgm pulse 1003. The C-state verify voltage VvC (e.g., waveform or signal 1011) may be applied after the waveform 1010. Thus, the bitcount of the B-state triggered the verify of the C-state in a subsequent verify iteration.

Figure 10B:
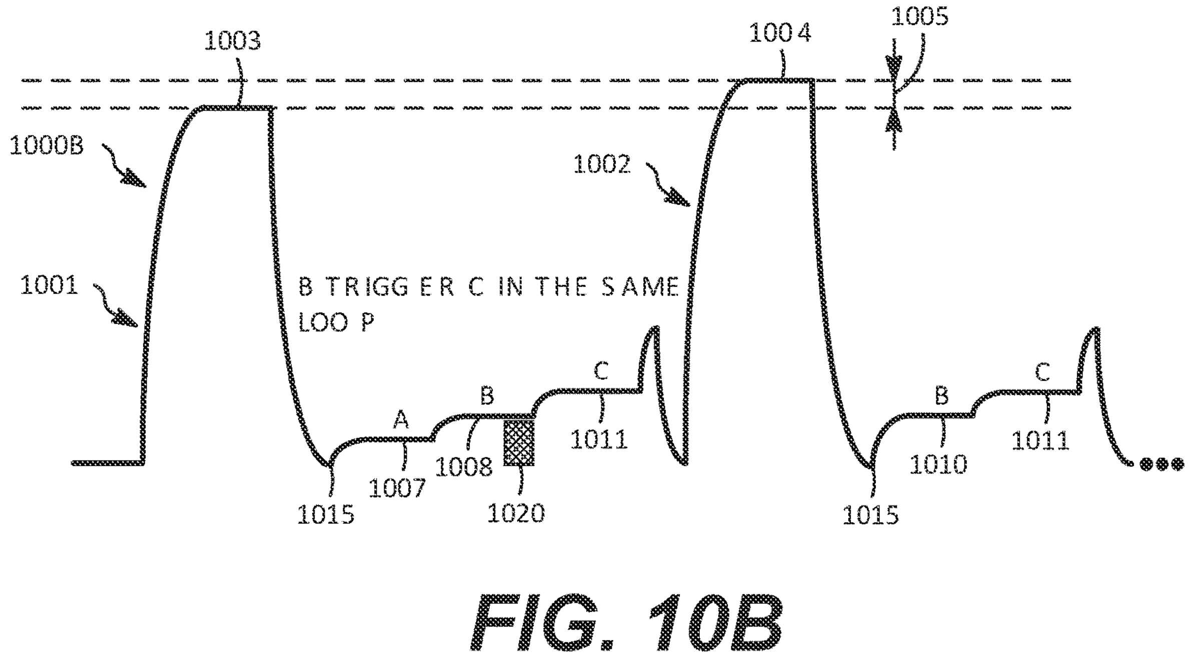
FIG. 10B illustrates a voltage levels in program verify iterations according to aspects of the disclosure.

FIG. 10B shows a program operation 1000B, which is similar to operation 1000A with same signal, e.g., voltage levels, being designated with the same reference numbers as in FIG. 10A. However, there is a difference. When the bitcount from the bitscan occurring at the B-state, e.g., based on signal 1008, it triggers the operation 1000B to conduct the C-level verify in the same iteration. That is, the C-level verify is performed in the same iteration as the preceding B-state that exceeded the threshold value for the bitscan count. The initial C-level verify occurs before the incremented program signal 1004. This is schematically shown at box 1020 whereat the bitscan count of B-state occurs and the memory controller detects that the count threshold is met or exceeded. The memory controller then applies the next verify state level before proceeding to the iteration 1002.

While the above example uses the A-state, the B-state, and the C-state for illustrative purposes, it is within the scope of additional embodiments to apply the same determination of the bitscan count meeting or exceeding the count threshold to trigger the verification of the next state. For example, the C-state can trigger the D-state verify in the same iteration. The D-state bitscan count determination can trigger the E-state verify in the same iteration. The E-state bitscan count determination can trigger the F-state verify in the same iteration. The F-state bitscan count determination can trigger the G-state verify in the same iteration.

Figure 10C:
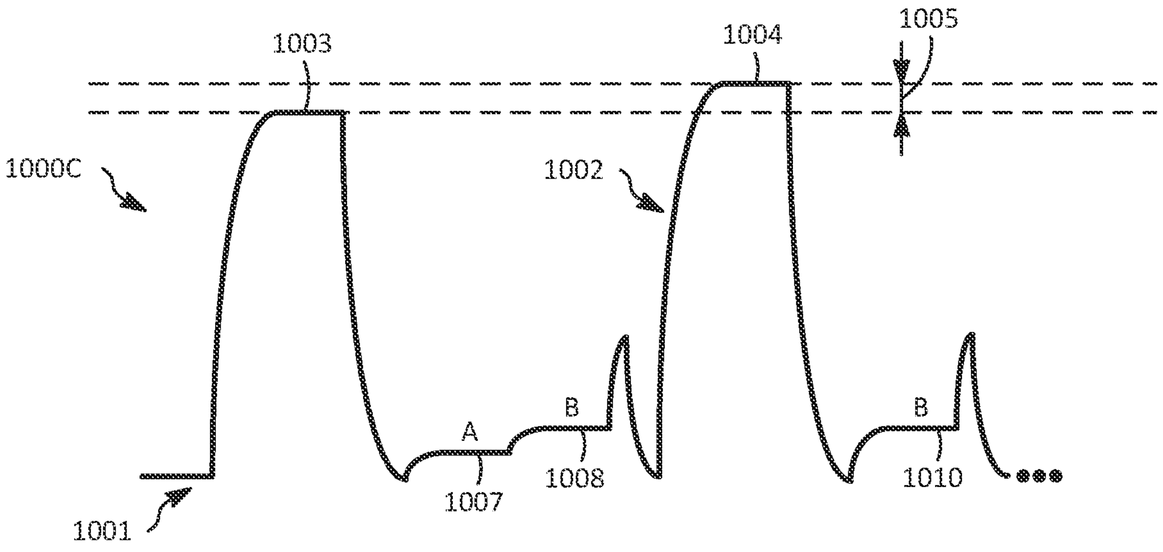
FIG. 10C illustrates a voltage levels in program verify iterations according to aspects of the disclosure.

FIG. 10C shows a program and verify operation 1000C that is similar to FIGS. 9A and 9B, and the same elements are designated with the same reference numbers. However, this operation 1000C is when the bitscan count for the B-state does not exceed or meet the threshold value. This is the operation 1000C that results from the embodiment shown in FIG. 9A. The C-state is not triggered early by a count in the first iteration and thus is not in the second iteration 1002 or triggered in the first iteration 1001.

Figure 11:
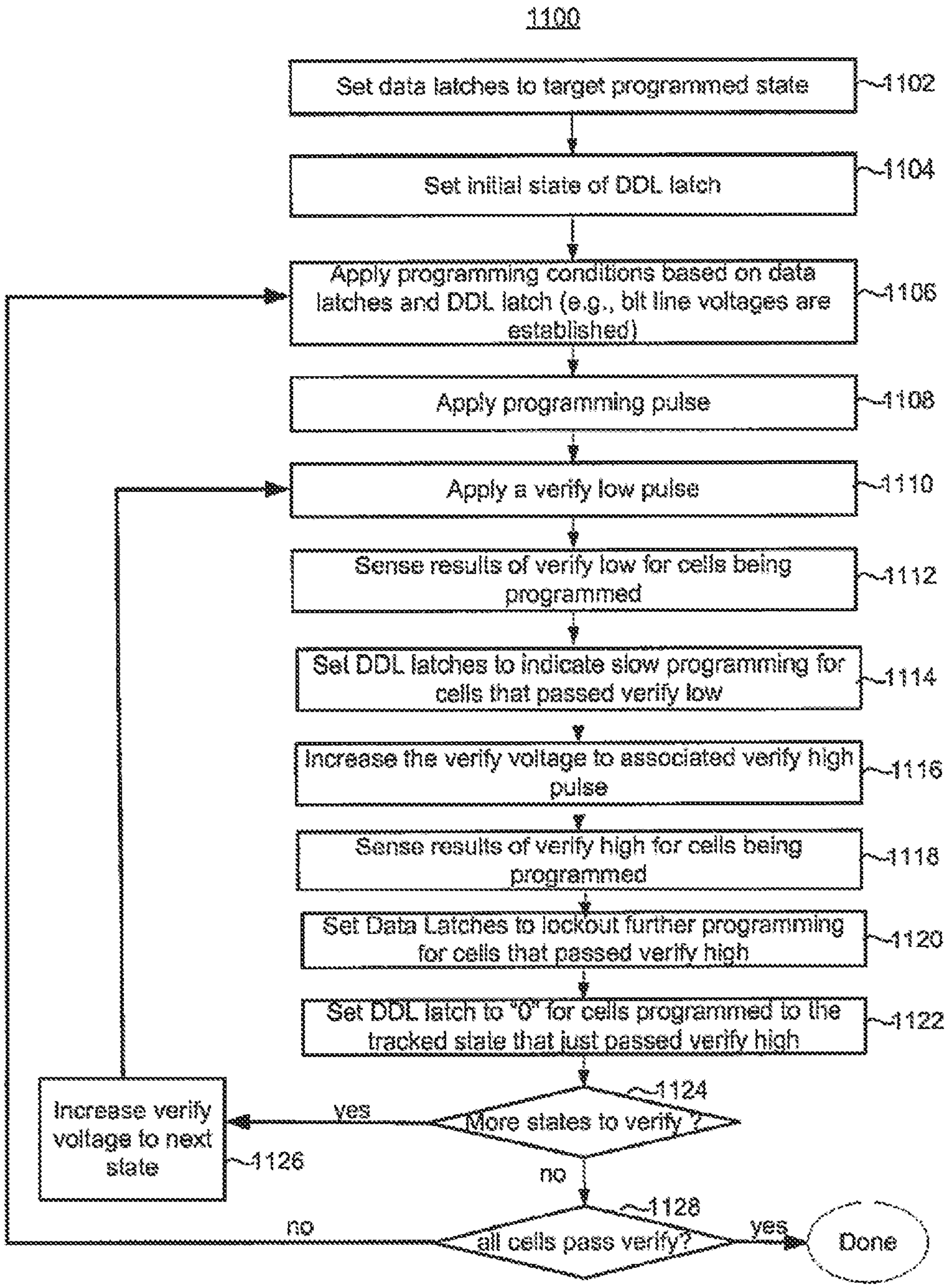
FIG. 11 is a flowchart of one embodiment of a process of operating data latches while programming and verifying non-volatile storage according to aspects of the disclosure.

FIG. 11 is a flowchart of one embodiment of a process 1100 of operating data latches while programming and verifying non-volatile storage. Process 1100 provides details of maintaining information that indicates which storage elements were programmed to a particular state. Note that data latches that initially indicate which state that a storage element is to be programmed to may be freed up during programming. Therefore, this information may be lost during the programming process. In one embodiment, the process 1100 "tracks" or maintains information for one state. By tracking a state, it is meant that the process 1100 maintains information after the programming is over as to which storage elements were intended to be programmed to a particular (tracked) state. Note that this may be the erased state, as well as any of the programmed states.

Process 1100 provides further details of one embodiment of steps 1002 and 1004 from FIG. 10. Reference will be made to a set of data latches 394 in FIG. 3. As noted above, three data latches ADL, BDL, and CDL initially store the data to be programmed into the storage element. Thus, the storage element stores three bits, in one embodiment. The fourth data latch, DDL, is used for what is referred to herein as "quick pass write" (QPW) status. Note that there could be more or fewer than four latches.

In step 1102, data latches are set to their target program state. In one embodiment, ADL, BDL, and CDL latches are set as indicated in FIG. 13A. Note that a different bit assignment may be used.

In step 1104, the DDL latch is set to an initial state. In one embodiment, the DDL latch is set as indicated in FIG. 13A. In that embodiment, the DDL latch for all storage elements is set to "0" except for those that are to remain in the erase-state. In one embodiment, every DDL latch is set to "0". In one embodiment, setting the DDL latch for all states to "0" is used when tracking the erased state.

In step 1106, programming conditions are applied based at least in part on the data latches. In one embodiment, bit line voltages are set. In one embodiment, three categories are used. One for storage elements that are locked out (or inhibited) from any further programming, one is for storage elements that are still undergoing fast programming, and one is for storage elements that are to receive slower programming because they are near their target threshold voltages.

In one embodiment, bit lines for storage elements locked out or inhibited storage elements are set to Vdd, bit lines for storage elements undergoing nominal (or fast) programming are set to ground (e.g., Vss), bit lines for the third category are set to an intermediate voltage between ground and Vdd. This intermediate voltage slows down the programming to some extent.

In step 1108, one or more programming pulses are applied to the selected word line. A pass voltage (e.g., Vpass) may be applied to unselected word lines.

In step 1110, a verify low pulse is applied to the selected word line. Referring to FIG. 5, VvAL may be applied. In step 1112, sensing is performed to determine whether storage elements that were intended to be programmed to the state associated with the verify low pulse have reached the verify low point. For example, storage elements intended to be programmed to the A-state (as indicated in ADL, BDL, CDL) are sensed to determine whether their threshold voltage is at or above VvAL. In one embodiment, the current of the bit line is sensed.

In step 1114, the DDL latches are set based on the results of step 1112. Note that the DDL latches in question are those associated with the state that was just verified. In one embodiment, the DDL latch is set to "1" to indicate that slow programming is to be performed. For example, storage elements intended to be programmed to the A-state that have a threshold voltage above VvAL have their DDL latch set to "1".

In step 1116, the verify reference voltage is increased to the associated verify high reference voltage for the present state being verified. For example, the reference voltage is set to VvA (see, FIG. 5). In one embodiment, step 1116 involves increasing the voltage on the selected word line.

In step 1118, sensing is performed to determine whether storage elements that were intended to be programmed to the state associated with the nominal verify pulse have reached the nominal verify point. For example, storage elements intended to be programmed to the A-state are sensed to determine whether their threshold voltage is at or above VvA. In one embodiment, the current of the bit line is sensed.

In step 1120, the ADL, BDL, and CDL latches are set based on the results of step 1120. Note that the latches in question are those associated with the state that was just verified. In one embodiment, one or more of the ADL, BDL, and CDL latches are set to "1" to indicate that programming is to be inhibited. For example, storage elements intended to be programmed to the A-state that have a threshold voltage above VvA have their ADL, BDL, and CDL latches set to "1".

Under some conditions only one or two of the data latches may be needed to indicate the lockout conditions. Thus, step 1120 includes setting one or more of latches ADL, BDL, and CDL to "1", in one embodiment. In one embodiment, the process 1100 keeps track of how far along the programming process is, and uses a different set of latches to indicate lockout depending on which stage programming is in. Further details are discussed below.

In step 1122, the DDL latch of storage elements being tracked may be set to "0", if they just passed program verify. For example, if the A-state is the being tracked, then the DDL latch of those storage elements that just passed program verify for the A-state have their DDL latch set to "0". However, if a state other than the A-state is being tracked (e.g., the A-state is not being tracked), then the DDL latch is left at "1". Note that the DDL latch should be at "1" when a storage element passed the nominal verify (e.g., VvA) in steps 1116-1118 because that storage element also should have passed verify low (e.g., VvAL) in steps 1112-1114. Note that setting the DDL latch appropriately in step 1112 allows information to be maintained as to the intended program state for one of the states.

Note that the state to be tracked may also include the erase state. Note that there is not a verify operation for storage elements that are to stay in the erase state. Therefore, for these storage elements the status of the DDL latch should not change at step 1114. When a state other than the erase state is being tracked, the DDL latch for storage elements to remain erased may be initially set to "1". However, when the erase state is being tracked, the DDL latch may be initially set to "0". Therefore, it should remain at "0" throughout programming. In contrast, the DDL latch for other states may be set to "1" when verify low passes.

In step 1124, a determination is made whether there are additional states to verify. Note that early in the programming operation, it is not required that all states be verified. If there are more states to verify, then the verify reference voltage is increased in step 1126. The reference voltage may be increased to the verify low reference level for the next state. Then, the verify low pulse may be applied in step 1110. When all states that are to be verified at this time are verified, a determination is made whether all storage elements passed verify, in step 1128. Note that a certain number of storage elements may fail to reach their intended state, but be ignored. This can help to speed up programming.

If not all storage element pass verify (factored in that some may be allowed to fail), then the process 1100 returns to step 1106 to apply programming conditions based on the latches 394. For storage elements that are now locked out (as indicated by one or more of latches ADL, BDL, CDL), their bit lines may be set to Vdd. For storage elements to receive slow programming, their bit lines may be set to the intermediate voltage. In one embodiment, the DDL latch of those storage elements that are not locked out from further programming is checked to determine whether slow programming should be performed.

FIG. 12 is a flowchart of one embodiment of a process 1200 of operating data latches while programming and verifying non-volatile storage. Process 1200 provides further details of using the data latches differently depending on the stage of the programming process. FIG. 13A-FIG. 13D are tables that show status of data latches ADL, BDL, CDL, and DDL throughout various stages of process 1200.

FIG. 14 shows latch usage during various stages of one embodiment of programming. Briefly, the programming process may be divided between the following stages. In the pre-lockout stage, data latches may be set up. In the ABCDEFG stage, all states are being programmed. In the EFG stage, only the E-, F-, and G-states are being programmed. In the G-program stage, only the G-state is being programmed. In the EPD-stage, erratic program detection is being performed. In one embodiment, word line defects are detected during the EPD stage. Note also that the ADL latches are reset between the ABCDEFG stage and the EFG stage. Likewise, the BDL latches are reset between the EFG stage and the G stage. Further details are discussed in connection with the discussion of FIG. 12.

Process 1200 describes one embodiment in which the G-state is the tracked state. In step 1202, the target data states are stored in latches. FIG. 13A shows a table of initial states for latches ADL, BDL, and CDL.

In step 1204, the initial state of the DDL latches are set. In this embodiment, the initial state for storage elements to remain in the erased state is set to "1." The DDL for all other storage elements is set to "0." FIG. 13A shows a table of initial states of the DDL latches for memory cells targeted for various states. Steps 1202 and 1204 may occur during the pre-lockout stage (see FIG. 14).

In step 1206, one or more programming pulses are applied, followed by verifying one or more states. One embodiment of step 1206 includes performing steps 1108, 1110, 1112, 1116, and 1118 of FIG. 11 one or more times. For example, step 1108 might be performed once, followed by steps 1110, 1112, 1116, and 1118 to verify different states.

Initially, the programming starts in the ABCDEFG stage (see FIG. 14). The black bars in FIG. 14 indicate when a data latch is actively being used for programming or EPD. During the ABCDEFG stage, the ADL, BDL, and CDL latches are being used to store lockout information. The DDL latches are being used to store QPW status.

FIG. 13B shows an example of use of the latches during the ABCDEFG stage. At this time, any storage element that is locked out has a "1" in all of the ADL, BDL, and CDL latches. The erase case is shown in this state. For states A-G, the data to be programmed into the storage element is shown. However, when a storage element reaches its intended target state, its ADL, BDL, and CDL latches maybe set to "1". This was previously discussed as one possibility in step 1120 of FIG. 11. Thus, when determining whether a storage element is locked out during the ABCDEFG stage, the status of the ADL, BDL, and CDL may be checked.

FIG. 13B also shows an example of use of the DDL latches during the ABCDEFG stage. In one embodiment, a "1" in the DDL latch means that slow programming is to be used. Thus, any storage element that is not locked out, and that has a "1" in the DDL latch may receive slow programming.

Note that the DDL latch is being used differently for the G-state. For storage elements to be programmed to the G-state, the DDL latch is kept at "0" throughout the programming process, in one embodiment.

In step 1208, a determination is made whether storage elements targeted for states A-D are programmed. Note that it is not required that every storage element targeted for these states reaches its intended state. In one embodiment, some storage elements may be left under-programmed. If programming of the A-D states is not yet complete, the process returns to step 1206.

When storage elements targeted for states A-D are programmed, the ADL latches are freed up, in step 1210. This is reflected by the ADL reset in FIG. 14 after the ABCDEFG program stage. Referring to FIG. 13C, the ADL latches are free at this time. Because the ADL latches are free, they may be used for background caching, as one example. Further details of using data latches that are freed up during a program operation are described in U.S. Pat. No. 7,502,260, entitled "Method for Non-Volatile Memory with Background Data Latch Caching Operations During Program Operations, to Li et al., which is hereby incorporated in its entirety for all purposes.

Note that after the ADL latches are freed up, programming proceeds with the EFG program stage (see FIG. 14). At this time, only the BDL and CDL latches are used to store the lockout information, in one embodiment. Also, only the BDL and CDL latches are needed to contain the information needed to uniquely define which state a storage element is being programmed to. For example, the combination "01" uniquely defines the E-state, the combination "10" uniquely defines the F-state, the combination "00" uniquely defines the G-state, the combination "11" uniquely defines the lockout state, in one embodiment. Other bit assignments may be used.

Further, note that in FIG. 13C, the DDL latches of all storage elements below the E-state should be at "1". Storage elements being programmed to either the E-state or F-state could have either a "1" or "0" in the DDL latch, depending on whether verify low has passed. As before, the DDL latch for the G-state storage elements remains at "0". In one embodiment, no verify low is performed of the G-state storage elements. Therefore, the DDL latch should state "0" throughout programming. However, a verify low could be performed of the G-state, so long as the DDL latch is set to "0" when the storage element is locked out, as one example.

Next, programming continues with the EFG-stage (see FIG. 14). When determining how to apply programming conditions (step 1211 of FIG. 12), the status of the BDL and CDL latches may be used for lockout. Storage elements that are not locked out, and that have a "1" in the DDL latch may receive slow programming.

In step 1212, a determination is made whether the E and F states are programmed. If not the process continues to program and verify, using the status of latches BDL, CDL, and DDL.

When the E- and F-states are programmed, the BDL latches are freed up in step 1214. This is reflected by BDL reset at the end of the EFG program stage (see FIG. 14). As with the ADL latch, the BDL latch is free for purposes such as background caching.

FIG. 13D shows a table that represents the BDL latches being freed up. At this time, the only storage elements left to be programmed are those in the G-state. Therefore, the status of the CDL latch may uniquely describe whether a storage element is to be programmed to the G-state ("0" in this example) or is locked out ("1" in this example).

Note that the status of the DDL latch is "0" for G-state storage elements at this time. As was previously noted, the DDL latch may stay at "0" for the G-state storage elements throughout programming.

Programming then continues with the G-program stage (see, FIG. 14). In step 1215, program conditions are applied based on the status of CDL and DDL. The status of the CDL latch may be used to determine which storage elements are locked out. The status of the DDL latch remains "0" for all G-state storage elements in one embodiment. However, in one embodiment, the DDL latch may be used for QPW status. Therefore, if this is the case, then storage elements that are not locked out and have the DDL latch set to "1" may receive slow programming.

When the G-state storage elements are programmed (step 1216), the G-program stage is over. At this time, the CDL latch for all G-state storage elements should be "1". The DDL latch for all G-state storage elements should be "0". Note that in one embodiment, the DDL latch is "0" because it is not allowed to be set to "1" during the programming operation.

However, in one embodiment, the DDL latch is permitted to be set to "1" when the G-state storage element passes verify low. In this case, the DDL latch may be set to "0" when the G-state storage element passes verify high.

Regardless of whether the information from the DDL latch is kept in that latch, transferred to another latch, or some other storage location, the information of which storage elements were targeted for the G-state is maintained after the programming operation. Note that no extra data latches are needed. Also note that two of the data latches are freed up during programming for purposes such as background caching.

As discussed above, delaying the verification of some later data states until certain earlier data states finish programming can improve program time. Nevertheless, this can result in the later data states being over programmed. Some memory apparatuses can exhibit a long scan time, which limits performance improvement through bit lines and word lines. FIG. 15 is a chart listing the program loop when each data state begins verify and when programming is complete for an example memory apparatus having quad-level memory cells (i.e., each memory cells stores 4 bits for 15 programmed data states S1-S15). The verify level and natural threshold voltage Vt distribution show state(N+7) cells will not be verified until state(N) program completes. Such operation is known as window verify. FIG. 16 shows verify windows as a program operation proceeds (i.e., the verify window shifts right as more program loops occur) for the example memory apparatus having quad-level memory cells and employing window verify. Window verify helps to reduce access to a data transfer latch (XDL) and achieve a scan time reduction. Window verify can result in a program time tPROG gain of 3.8 MB/s (6.2% improvement). In addition, but line BL precharge time can decrease by 1 us or more owing to the removal of bit line precharge during a second verify period of time (RWL_CLK) in program-verify that bring additional 1 MB/s program time tPROG gain. Thus, window verify can provide a total performance gain of 4.8 MB/s (7.9% improvement).

In the example shown in FIGS. 15 and 16, higher data states (e.g., S8-S15) have a possibility of over program (OP) due to the verify windows being limited. Specifically, if state N is not completed before state N+7 verify starts, state N+7 will have OP. FIG. 17 shows one of the verify windows for the example memory apparatus having quad-level memory cells and employing window verify to illustrate an over program issue. Over program is especially important for a multi-plane case, it has higher possibility of OP due to plane variation for the program loops. Some memory apparatuses have four planes and a 16k page structure physically separated by 8 k, so the variation would be worse. Therefore, screening whether State N is not completed before state N+7 verify starts would be advantageous.

Consequently, described herein is a memory apparatus (e.g., non-volatile storage device 210 of FIG. 2) including memory cells (e.g., transistors, 100, 102, 104 and 106 of FIG. 1B) each connected to one of a plurality of word lines (e.g., word lines WL3, WL2, WL1 and WL0 of FIG. 1B or WL0-WL63 of FIG. 4). The memory cells are disposed in strings (e.g., NAND string 90 of FIGS. 1A and 1B) and are configured to retain a threshold voltage Vt or Vth corresponding to one of a plurality of memory or data states (e.g., FIGS. 5 and 6). The memory apparatus also includes a control circuit or means (e.g., one or any combination of control circuitry 220, decoders 240A, 240B, 242A and 242B, power control module 226, sense blocks 300, read/write circuits 230A and 230B, controller 244 of FIG. 2 and so forth) coupled to the plurality of word lines and the strings. The control means is configured to apply each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation. The memory cells associated with predetermined ones of the plurality of data states are not verified until the memory cells associated with specific prior ones of the plurality of data states finish programming to define verify windows (e.g., see rectangular boxes of FIG. 15) ranging between each one of the specific prior ones of the plurality of data states (i.e., the data state at the left side of one of the rectangular boxes, e.g., S1) and each one of the predetermined ones (i.e., the data state at the right side of the one of the rectangular boxes, e.g., S7). The control means adjusts at least one of the verify windows in response to the memory cells associated with one of the specific prior ones of the plurality of data states not finishing programming before the one of the predetermined ones of the at least one of the verify windows is verified. The verify windows may also be thought of as a single verify window that shifts right as program loops complete.

As discussed above, the memory apparatus can have numerous latches (e.g., data latches 394, 395, 396, 397 of FIG. 3). The latches can include a first user data latch ADL, a second user data latch BDL, and a third user data latch CDL configured to store data to be programmed during the program operation. The latches can also include a data transfer latch XDL coupled to a data bus and configured to receive the data to be programmed from the data bus. The memory apparatus can also include a first data latch SDL coupled to one of the plurality of bit lines each coupled to the strings and configured to control the one of the plurality of bit lines to allow or inhibit programming of the memory cells of the strings coupled to the one of the bit lines. In addition, a second data latch TDL may be coupled to the data bus and configured to store bits used in logic operations with the data from the data bus. The control means is further configured to operate and update the first user data latch ADL and the second user data latch BDL and the third user data latch CDL and the data transfer latch XDL and the first data latch SDL and the second data latch TDL based on the data being programmed to the memory cells and which of the plurality of data states is being programmed and verified during the program operation.

Each of the plurality of program loops of the program operation can include a first verify period of time R_CLK and a second verify period of time RWL_CLK in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed.

FIG. 18 shows an adjustment to the verify windows for an example memory apparatus having quad-level memory cells. According to an aspect, the plurality of data states include an erased data state (e.g., S0 in FIGS. 15-18 or Erase in FIGS. 5 and 6) and a plurality of lower data states (e.g., states S1-S7 of FIGS. 15-18 or data states A-C of FIGS. 5 and 6) comprising one half of the plurality of data states corresponding to the threshold voltage being relatively lower in magnitude. The plurality of data states also include a plurality of higher data states (e.g., states S8-S15 of FIGS. 15-18 or data states D-G of FIGS. 5 and 6) comprising another half of the plurality of data states corresponding to the threshold voltage being relatively higher in magnitude compared to the plurality of lower data states. The verify windows include a high data state window (e.g., see boxed area on the left hand side of FIG. 18) including only the plurality of higher data states and a plurality of normal verify windows (e.g., see boxed area on the right hand side of FIG. 18) spanning half of the plurality of data states and varying based on which of the plurality of data states have not yet completed programming. The control means is further configured to adjust the at least one of the verify windows to the high data state window at the first verify period of time in response to the memory cells associated with the one of the specific prior ones of the plurality of data states not finishing programming before the one of the predetermined ones of the at least one of the verify windows is verified. The control means is also configured to switch the at least one of the verify windows to the normal verify windows at the second verify period of time in response to finishing verification of the plurality of higher data states.

Thus, in more detail and according to an aspect, each of the memory cells is configured to store four bits and the plurality of data states includes, in order of the threshold voltage increasing in magnitude, the erased data state and a plurality of programmed data states ranging from a first data state (e.g., S1) to a fifteenth data state (e.g., S15). The high data state window includes the plurality of data states ranging from an eighth data state (e.g., S8) to the fifteenth data state (e.g., S15). So, the control means is further configured to set a value of the first data latch SDL as logically not a first quantity (e.g., A & B & C & T) anded with not the data transfer latch XDL during the first verify period of time R_CLK. The first quantity is logically the first user data latch ADL anded with the second user data latch BDL anded with the third user data latch CDL and the second data latch TDL (i.e., S=~(A & B & C & T) & ~X). The control means also updates the value of the first data latch SDL as logically not the first quantity anded with not the data transfer latch XDL during the second verify period of time RWL_CLK in response to a last one of the plurality of data states of the normal verify windows being verified (i.e., S=~(A & B & C & T) & X). FIGS. 19A and 19B show the contents of the first user data latch ADL, the second user data latch BDL, the third user data latch CDL, the data transfer latch XDL, the first data latch SDL, and the second data latch TDL for each of the plurality of data states and scan conditions for the example memory apparatus having quad-level memory cells employing the adjustment to the verify windows of FIG. 18.

So, to prevent the over program (OP) issue for the higher data states when state N programming is not completed before state N+7 verify starts, the higher states window program-verify process above is applied. The bit line can be precharged PCHSEL(SDL=1) for higher states (S8-S15) only when the data transfer latch XDL=0. Again, the first data latch SDL will be set at first verify period of time R_CLK(R1). When the higher states finish program-verify (pvfy), the control means switches back to normal window pvfy (XDL=1). The first data latch SDL will be updated at the second verify period of time RWL_CLK. This approach can help minimize access to the data transfer latch XDL (only 2 times in a pvfy loop). Thus, program time tPROG is improved. In addition, current consumption ICC is improved, since each of the plurality of verify windows is fixed to 7 states. However, bit line BL settling time may need to be monitored when switching to the normal verify windows (XDL=1) at the second verify period of time RWL_CLK.

FIG. 20 shows another adjustment to the verify windows for an example memory apparatus having quad-level memory cells. Again, the plurality of data states include an erased data state (e.g., S0 in FIGS. 15-18 or Erase in FIGS. 5 and 6) and a plurality of lower data states (e.g., states S1-S7 of FIGS. 15-18 or data states A-C of FIGS. 5 and 6) comprising one half of the plurality of data states corresponding to the threshold voltage being relatively lower in magnitude. The plurality of data states also include the plurality of higher data states (e.g., states S8-S15 of FIGS. 15-18 and 20 or data states D-G of FIGS. 5 and 6) comprising another half of the plurality of data states corresponding to the threshold voltage being relatively higher in magnitude compared to the plurality of lower data states. The verify windows include the plurality of normal verify windows (e.g., see boxed area on the right hand side of FIG. 20) spanning half of the plurality of data states and varying based on which of the plurality of data states have not yet completed programming. So, according to another aspect, the control means is further configured to extend the at least one of the verify windows by a predetermined number of the plurality of data states a for the plurality of higher data states at the first verify period of time R_CLK in response to the memory cells associated with the one of the specific prior ones of the plurality of data states not finishing programming before the one of the predetermined ones of the at least one of the verify windows is verified. The control means then switches the at least one of the verify windows to the normal verify windows at the second verify period of time RWL_CLK in response to finishing verification of the plurality of data states in a last one of the plurality of data states of the at least one of the verify windows that has been extended.

In more detail and according to an aspect, the control means is further configured to set a value of the first data latch SDL as logically the first user data latch ADL anded with not the second user data latch BDL anded with the third user data latch CDL ored with the first data latch SDL. The control means is also configured to update the value of the first data latch SDL as logically the first data latch SDL and the data transfer latch XDL during the second verify period of time RWL_CLK in response to a last one of the plurality of data states of the normal verify windows being verified. FIGS. 21A and 21B show the contents of the first user data latch ADL, the second user data latch BDL, the third user data latch CDL, the data transfer latch XDL, the first data latch SDL, and the second data latch TDL for each of the plurality of data states and scan conditions for the example memory apparatus having quad-level memory cells employing the adjustment to the verify windows of FIG. 20.

So, If state N is not completed before state N+7 verify starts, the plurality of verify windows will be extended to"N+7+a" states. The bit line can be precharged PCHSEL (SDL=1) for 7 states (XDL=1) plus the predetermined number of the plurality of data states a (XDL=0). Again, the first data latch SDL will be set at first verify period of time R_CLK. When the higher states finish program-verify (pvfy), the control means switches back to normal window pvfy (XDL=1). The first data latch SDL will then be updated at the second verify period of time RWL_CLK. This approach can help minimize access to the data transfer latch XDL (only 2 times in a pvfy loop). Thus, program time tPROG is improved. However, bit line BL settling time may need an additional precharge time parameter.

As discussed above, the memory apparatus may also utilize smart skip program verify or smart program count verify (PCV) to determine when memory cells associated with each of the plurality of data states are verified. Thus, the control means is further configured to, in a smart program count verify process count an upper tail quantity of the memory cells associated with an earlier one of the plurality of data states (e.g., area 803 of FIG. 8) having the threshold voltage above one of the plurality of program verify voltages (e.g., verify level of state B in FIG. 8) associated with earlier one of the plurality of data states. The control means determines whether the upper tail quantity is greater than or equal to a predetermined upper tail threshold. The control means is then configured to apply a subsequent one of the series of programming pulses of the program voltage to the selected ones of the plurality of word lines during another of the plurality of program loops of the program operation in response to determining the upper tail quantity is not greater than or equal to the predetermined upper tail threshold. The control means is additionally configured to apply one of the verification pulses of the one of the plurality of program verify voltages associated with a later one of the plurality of data states to the selected ones of the plurality of word lines to determine whether the memory cells connected thereto have the threshold voltage above the one of the plurality of program verify voltages associated with the later one of the plurality of data states without triggering a next program pulse in response to determining the upper tail quantity is greater than or equal to the predetermined upper tail threshold.

The memory apparatus can also include a program completion parameter COMP_PROG_S (see e.g., FIGS. 19B and 21B) configured to indicate when the memory cells being programmed for one of the plurality of data states have the threshold voltage above one of the plurality of program verify voltages associated with the one of the plurality of data states targeted for the memory cells. So, according to an aspect, the control means is further configured to prioritize selection of the one of the plurality of data states to verify based on the smart program count verify process rather than the program completion parameter COMP_PROG_S. Such prioritization helps avoid potential OP(Over Program) issues.

FIG. 22 illustrates steps of a method of operating a memory apparatus. As discussed above, the memory apparatus (e.g., non-volatile storage device 210 of FIG. 2) includes memory cells (e.g., transistors, 100, 102, 104 and 106 of FIG. 1B) each connected to one of a plurality of word lines (e.g., word lines WL3, WL2, WL1 and WL0 of FIG. 1B or WL0-WL63 of FIG. 4). The memory cells are disposed in strings (e.g., NAND string 90 of FIGS. 1A and 1B) and are configured to retain a threshold voltage Vt or Vth corresponding to one of a plurality of memory or data states (e.g., FIGS. 5 and 6). The method includes the step of 1300 applying each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation, the memory cells associated with predetermined ones of the plurality of data states not being verified until the memory cells associated with specific prior ones of the plurality of data states finish programming to define verify windows ranging between each one of the specific prior ones of the plurality of data states and each one of the predetermined ones. The method also includes the step of 1302 adjusting at least one of the verify windows in response to the memory cells associated with one of the specific prior ones of the plurality of data states not finishing programming before the one of the predetermined ones of the at least one of the verify windows is verified.

Again, the latches can include a first user data latch ADL, a second user data latch BDL, and a third user data latch CDL configured to store data to be programmed during the program operation. The latches can also include a data transfer latch XDL coupled to a data bus and configured to receive the data to be programmed from the data bus. The memory apparatus can also include a first data latch SDL coupled to one of the plurality of bit lines each coupled to the strings and configured to control the one of the plurality of bit lines to allow or inhibit programming of the memory cells of the strings coupled to the one of the bit lines. In addition, a second data latch TDL may be coupled to the data bus and configured to store bits used in logic operations with the data from the data bus. So, the method can further include the step of operating and updating the first user data latch ADL and the second user data latch BDL and the third user data latch CDL and the data transfer latch XDL and the first data latch SDL and the second data latch TDL based on the data being programmed to the memory cells and which of the plurality of data states is being programmed and verified during the program operation.

As described above, each of the plurality of program loops of the program operation can include the first verify period of time R_CLK and a second verify period of time RWL_CLK in which the verification pulses of the plurality of program verify voltages each associated with one of the plurality of data states are applied to selected ones of the plurality of word lines to determine whether the memory cells connected thereto have the threshold voltage above each of the plurality of program verify voltages associated with the plurality of data states targeted for each of the memory cells being programmed. The plurality of data states include an erased data state (e.g., S0 in FIGS. 15-18 or Erase in FIGS. 5 and 6) and a plurality of lower data states (e.g., states S1-S7 of FIGS. 15-18 or data states A-C of FIGS. 5 and 6) comprising one half of the plurality of data states corresponding to the threshold voltage being relatively lower in magnitude. The plurality of data states also include a plurality of higher data states (e.g., states S8-S15 of FIGS. 15-18 and 20 or data states D-G of FIGS. 5 and 6) comprising another half of the plurality of data states corresponding to the threshold voltage being relatively higher in magnitude compared to the plurality of lower data states. The verify windows include the plurality of normal verify windows (e.g., see boxed area on the right hand side of FIG. 18) spanning half of the plurality of data states and varying based on which of the plurality of data states have not yet completed programming. So, according to another aspect, the method further includes the step of adjusting the at least one of the verify windows to the high data state window at the first verify period of time R_CLK in response to the memory cells associated with the one of the specific prior ones of the plurality of data states not finishing programming before the one of the predetermined ones of the at least one of the verify windows is verified. The next step of the method is switching the at least one of the verify windows to the normal verify windows at the second verify period of time RWL_CLK in response to finishing verification of the plurality of higher data states.

As above, each of the memory cells can be configured to store four bits and the plurality of data states includes, in order of the threshold voltage increasing in magnitude, the erased data state (e.g. S0) and a plurality of programmed data states ranging from a first data state (e.g., S1) to a fifteenth data state (e.g., S15). The high data state window includes the plurality of data states ranging from an eighth data state (e.g., S8) to the fifteenth data state (e.g., S15). Therefore, the method can further include the step of setting a value of the first data latch SDL as logically not a first quantity (e.g., A & B & C & T) anded with not the data transfer latch XDL during the first verify period of time R_CLK. The first quantity is logically the first user data latch ADL anded with the second user data latch BDL anded with the third user data latch CDL and the second data latch TDL (i.e., S=~(A & B & C & T) & ~X). The method also includes the step of updating the value of the first data latch SDL as logically not the first quantity anded with not the data transfer latch XDL during the second verify period of time RWL_CLK in response to a last one of the plurality of data states of the normal verify windows being verified (i.e., S=~(A & B & C & T) & X).

Once again, the plurality of data states can include the erased data state (e.g., S0 in FIGS. 15-18 or Erase in FIGS. 5 and 6) and the plurality of lower data states (e.g., states S1-S7 of FIGS. 15-18 or data states A-C of FIGS. 5 and 6) comprising one half of the plurality of data states corresponding to the threshold voltage being relatively lower in magnitude. The plurality of data states can also include the plurality of higher data states (e.g., states S8-S15 of FIGS. 15-18 and 20 or data states D-G of FIGS. 5 and 6) comprising another half of the plurality of data states corresponding to the threshold voltage being relatively higher in magnitude compared to the plurality of lower data states. The verify windows include the plurality of normal verify windows (e.g., see boxed area on the right hand side of FIG. 20) spanning half of the plurality of data states and varying based on which of the plurality of data states have not yet completed programming. So, according to another aspect, the method further includes the step of extending the at least one of the verify windows by a predetermined number of the plurality of data states a for the plurality of higher data states at the first verify period of time R_CLK in response to the memory cells associated with the one of the specific prior ones of the plurality of data states not finishing programming before the one of the predetermined ones of the at least one of the verify windows is verified. The method continues by switching the at least one of the verify windows to the normal verify windows at the second verify period of time RWL_CLK in response to finishing verification of the plurality of data states in a last one of the plurality of data states of the at least one of the verify windows that has been extended.

More specifically, the method further includes the step of setting a value of the first data latch SDL as logically the first user data latch ADL anded with not the second user data latch BDL anded with the third user data latch CDL ored with the first data latch SDL. The method continues by updating the value of the first data latch SDL as logically the first data latch SDL and the data transfer latch XDL during the second verify period of time RWL_CLK in response to a last one of the plurality of data states of the normal verify windows being verified.

Again, the memory apparatus may also utilize smart skip program verify or smart program count verify (PCV) to determine when memory cells associated with each of the plurality of data states are verified. Therefore, in in a smart program count verify process, the method further includes the step of counting an upper tail quantity of the memory cells associated with an earlier one of the plurality of data states having the threshold voltage above one of the plurality of program verify voltages associated with earlier one of the plurality of data states. The method also includes the step of determining whether the upper tail quantity is greater than or equal to a predetermined upper tail threshold. The next step of the method is applying a subsequent one of the series of programming pulses of the program voltage to the selected ones of the plurality of word lines during another of the plurality of program loops of the program operation in response to determining the upper tail quantity is not greater than or equal to the predetermined upper tail threshold. The method proceeds by applying one of the verification pulses of the one of the plurality of program verify voltages associated with a later one of the plurality of data states to the selected ones of the plurality of word lines to determine whether the memory cells connected thereto have the threshold voltage above the one of the plurality of program verify voltages associated with the later one of the plurality of data states without triggering a next program pulse in response to determining the upper tail quantity is greater than or equal to the predetermined upper tail threshold.

As mentioned above, the memory apparatus can also include a program completion parameter COMP_PROG_S (see e.g., FIGS. 19B and 21B) configured to indicate when the memory cells being programmed for one of the plurality of data states have the threshold voltage above one of the plurality of program verify voltages associated with the one of the plurality of data states targeted for the memory cells. Thus, according to an aspect, the method further includes the step of prioritizing selection of the one of the plurality of data states to verify based on the smart program count verify process rather than the program completion parameter.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A memory apparatus, comprising:

memory cells each connected to one of a plurality of word lines and disposed in strings and configured to retain a threshold voltage corresponding to one of a plurality of data states; and a control means coupled to the plurality of word lines and the strings and configured to:

apply each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation, the memory cells associated with predetermined ones of the plurality of data states not being verified until the memory cells associated with specific prior ones of the plurality of data states finish programming to define verify windows ranging between each one of the specific prior ones of the plurality of data states and each one of the predetermined ones, and adjust at least one of the verify windows in response to the memory cells associated with one of the specific prior ones of the plurality of data states not finishing programming before the one of the predetermined ones of the at least one of the verify windows is verified.

2. The memory apparatus as set forth in claim 1, further including a first user data latch and a second user data latch and a third user data latch configured to store data to be programmed during the program operation and a data transfer latch coupled to a data bus and configured to receive the data to be programmed from the data bus and a first data latch coupled to one of a plurality of bit lines each coupled to the strings and configured to control the one of the plurality of bit lines to allow or inhibit programming of the memory cells of the strings coupled to the one of the bit lines and a second data latch coupled to the data bus and configured to store bits used in logic operations with the data from the data bus, and wherein the control means is further configured to operate and update the first user data latch and the second user data latch and the third user data latch and the data transfer latch and the first data latch and the second data latch based on the data being programmed to the memory cells and which of the plurality of data states is being programmed and verified during the program operation.

3. The memory apparatus as set forth in claim 2, wherein each of the plurality of program loops of the program operation include a first verify period of time and a second verify period of time in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed, the plurality of data states include an erased data state and a plurality of lower data states comprising one half of the plurality of data states corresponding to the threshold voltage being relatively lower in magnitude and a plurality of higher data states comprising another half of the plurality of data states corresponding to the threshold voltage being relatively higher in magnitude compared to the plurality of lower data states, the verify windows include a high data state window including only the plurality of higher data states and a plurality of normal verify windows spanning half of the plurality of data states and varying based on which of the plurality of data states have not yet completed programming, and the control means is further configured to:

adjust the at least one of the verify windows to the high data state window at the first verify period of time in response to the memory cells associated with the one of the specific prior ones of the plurality of data states not finishing programming before the one of the predetermined ones of the at least one of the verify windows is verified; and switch the at least one of the verify windows to the normal verify windows at the second verify period of time in response to finishing verification of the plurality of higher data states.

4. The memory apparatus as set forth in claim 3, wherein each of the memory cells is configured to store four bits and the plurality of data states includes, in order of the threshold voltage increasing in magnitude, the erased data state and a plurality of programmed data states ranging from a first data state to a fifteenth data state, the high data state window includes the plurality of data states ranging from an eighth data state to the fifteenth data state, and the control means is further configured to:

set a value of the first data latch as logically not a first quantity anded with not the data transfer latch during the first verify period of time, the first quantity being logically the first user data latch anded with the second user data latch anded with the third user data latch and the second data latch; and update the value of the first data latch as logically not the first quantity anded with not the data transfer latch during the second verify period of time in response to a last one of the plurality of data states of the normal verify windows being verified.

5. The memory apparatus as set forth in claim 2, wherein each of the plurality of program loops of the program operation include a first verify period of time and a second verify period of time in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed, the plurality of data states include an erased data state and a plurality of lower data states comprising one half of the plurality of data states corresponding to the threshold voltage being relatively lower in magnitude and a plurality of higher data states comprising another half of the plurality of data states corresponding to the threshold voltage being relatively higher in magnitude compared to the plurality of lower data states, the verify windows include a plurality of normal verify windows spanning half of the plurality of data states and varying based on which of the plurality of data states have not yet completed programming, and the control means is further configured to:

extend the at least one of the verify windows by a predetermined number of the plurality of data states for the plurality of higher data states at the first verify period of time in response to the memory cells associated with the one of the specific prior ones of the plurality of data states not finishing programming before the one of the predetermined ones of the at least one of the verify windows is verified; and switch the at least one of the verify windows to the normal verify windows at the second verify period of time in response to finishing verification of the plurality of data states in a last one of the plurality of data states of the at least one of the verify windows that has been extended.

6. The memory apparatus as set forth in claim 5, wherein each of the memory cells is configured to store four bits and the plurality of data states includes, in order of the threshold voltage increasing in magnitude, the erased data state and a plurality of programmed data states ranging from a first data state to a fifteenth data state, the high data state window includes the plurality of data states ranging from an eighth data state to the fifteenth data state, and the control means is further configured to:

set a value of the first data latch as logically the first user data latch anded with not the second user data latch anded with the third user data latch ored with the first data latch; and update the value of the first data latch as logically the first data latch and the data transfer latch during the second verify period of time in response to a last one of the plurality of data states of the normal verify windows being verified.

7. The memory apparatus as set forth in claim 1, wherein the control means is further configured to, in a smart program count verify process:

count an upper tail quantity of the memory cells associated with an earlier one of the plurality of data states having the threshold voltage above one of the plurality of program verify voltages associated with earlier one of the plurality of data states;

determine whether the upper tail quantity is greater than or equal to a predetermined upper tail threshold;

apply a subsequent one of the series of programming pulses of the program voltage to the selected ones of the plurality of word lines during another of the plurality of program loops of the program operation in response to determining the upper tail quantity is not greater than or equal to the predetermined upper tail threshold; and apply one of the verification pulses of the one of the plurality of program verify voltages associated with a later one of the plurality of data states to the selected ones of the plurality of word lines to determine whether the memory cells connected thereto have the threshold voltage above the one of the plurality of program verify voltages associated with the later one of the plurality of data states without triggering a next program pulse in response to determining the upper tail quantity is greater than or equal to the predetermined upper tail threshold.

8. The memory apparatus as set forth in claim 7, wherein the memory apparatus also includes a program completion parameter configured to indicate when the memory cells being programmed for one of the plurality of data states have the threshold voltage above one of the plurality of program verify voltages associated with the one of the plurality of data states targeted for the memory cells and the control means is further configured to prioritize selection of the one of the plurality of data states to verify based on the smart program count verify process rather than the program completion parameter.

9. A controller in communication with a memory apparatus including memory cells each connected to one of a plurality of word lines and disposed in strings and configured to retain a threshold voltage corresponding to one of a plurality of data states, the controller configured to:

instruct the memory apparatus to apply each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation, the memory cells associated with predetermined ones of the plurality of data states not being verified until the memory cells associated with specific prior ones of the plurality of data states finish programming to define verify windows ranging between each one of the specific prior ones of the plurality of data states and each one of the predetermined ones; and adjust at least one of the verify windows in response to the memory cells associated with one of the specific prior ones of the plurality of data states not finishing programming before the one of the predetermined ones of the at least one of the verify windows is verified.

10. The controller as set forth in claim 9, wherein the memory apparatus further includes a first user data latch and a second user data latch and a third user data latch configured to store data to be programmed during the program operation and a data transfer latch coupled to a data bus and configured to receive the data to be programmed from the data bus and a first data latch coupled to one of a plurality of bit lines each coupled to the strings and configured to control the one of the plurality of bit lines to allow or inhibit programming of the memory cells of the strings coupled to the one of the bit lines and a second data latch coupled to the data bus and configured to store bits used in logic operations with the data from the data bus, and the controller is further configured to operate and update the first user data latch and the second user data latch and the third user data latch and the data transfer latch and the first data latch and the second data latch based on the data being programmed to the memory cells and which of the plurality of data states is being programmed and verified during the program operation.

11. The controller as set forth in claim 10, wherein each of the plurality of program loops of the program operation include a first verify period of time and a second verify period of time in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed, the plurality of data states include an erased data state and a plurality of lower data states comprising one half of the plurality of data states corresponding to the threshold voltage being relatively lower in magnitude and a plurality of higher data states comprising another half of the plurality of data states corresponding to the threshold voltage being relatively higher in magnitude compared to the plurality of lower data states, the verify windows include a high data state window including only the plurality of higher data states and a plurality of normal verify windows spanning half of the plurality of data states and varying based on which of the plurality of data states have not yet completed programming, and the controller is further configured to:

adjust the at least one of the verify windows to the high data state window at the first verify period of time in response to the memory cells associated with the one of the specific prior ones of the plurality of data states not finishing programming before the one of the predetermined ones of the at least one of the verify windows is verified; and switch the at least one of the verify windows to the normal verify windows at the second verify period of time in response to finishing verification of the plurality of higher data states.

12. The controller as set forth in claim 10, wherein each of the plurality of program loops of the program operation include a first verify period of time and a second verify period of time in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed, the plurality of data states include an erased data state and a plurality of lower data states comprising one half of the plurality of data states corresponding to the threshold voltage being relatively lower in magnitude and a plurality of higher data states comprising another half of the plurality of data states corresponding to the threshold voltage being relatively higher in magnitude compared to the plurality of lower data states, the verify windows include a plurality of normal verify windows spanning half of the plurality of data states and varying based on which of the plurality of data states have not yet completed programming, and the controller is further configured to:

extend the at least one of the verify windows by a predetermined number of the plurality of data states for the plurality of higher data states at the first verify period of time in response to the memory cells associated with the one of the specific prior ones of the plurality of data states not finishing programming before the one of the predetermined ones of the at least one of the verify windows is verified; and switch the at least one of the verify windows to the normal verify windows at the second verify period of time in response to finishing verification of the plurality of data states in a last one of the plurality of data states of the at least one of the verify windows that has been extended.

13. A method of operating a memory apparatus including memory cells each connected to one of a plurality of word lines and disposed in strings and configured to retain a threshold voltage corresponding to one of a plurality of data states, the method comprising the steps of:

applying each of a series of programming pulses of a program voltage followed by verification pulses of a plurality of program verify voltages each associated with one of the plurality of data states to selected ones of the plurality of word lines to program and verify the memory cells connected thereto during each of a plurality of program loops of a program operation, the memory cells associated with predetermined ones of the plurality of data states not being verified until the memory cells associated with specific prior ones of the plurality of data states finish programming to define verify windows ranging between each one of the specific prior ones of the plurality of data states and each one of the predetermined ones; and adjusting at least one of the verify windows in response to the memory cells associated with one of the specific prior ones of the plurality of data states not finishing programming before the one of the predetermined ones of the at least one of the verify windows is verified.

14. The method as set forth in claim 13, wherein the memory apparatus further includes a first user data latch and a second user data latch and a third user data latch configured to store data to be programmed during the program operation and a data transfer latch coupled to a data bus and configured to receive the data to be programmed from the data bus and a first data latch coupled to one of a plurality of bit lines each coupled to the strings and configured to control the one of the plurality of bit lines to allow or inhibit programming of the memory cells of the strings coupled to the one of the bit lines and a second data latch coupled to the data bus and configured to store bits used in logic operations with the data from the data bus, and the method further includes the step of operating and updating the first user data latch and the second user data latch and the third user data latch and the data transfer latch and the first data latch and the second data latch based on the data being programmed to the memory cells and which of the plurality of data states is being programmed and verified during the program operation.

15. The method as set forth in claim 14, wherein each of the plurality of program loops of the program operation include a first verify period of time and a second verify period of time in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed, the plurality of data states include an erased data state and a plurality of lower data states comprising one half of the plurality of data states corresponding to the threshold voltage being relatively lower in magnitude and a plurality of higher data states comprising another half of the plurality of data states corresponding to the threshold voltage being relatively higher in magnitude compared to the plurality of lower data states, the verify windows include a high data state window including only the plurality of higher data states and a plurality of normal verify windows spanning half of the plurality of data states and varying based on which of the plurality of data states have not yet completed programming, and the method further includes the steps of:

adjusting the at least one of the verify windows to the high data state window at the first verify period of time in response to the memory cells associated with the one of the specific prior ones of the plurality of data states not finishing programming before the one of the predetermined ones of the at least one of the verify windows is verified; and switching the at least one of the verify windows to the normal verify windows at the second verify period of time in response to finishing verification of the plurality of higher data states.

16. The method as set forth in claim 15, wherein each of the memory cells is configured to store four bits and the plurality of data states includes, in order of the threshold voltage increasing in magnitude, the erased data state and a plurality of programmed data states ranging from a first data state to a fifteenth data state, the high data state window includes the plurality of data states ranging from an eighth data state to the fifteenth data state, and the method further includes the steps of:

setting a value of the first data latch as logically not a first quantity anded with not the data transfer latch during the first verify period of time, the first quantity being logically the first user data latch anded with the second user data latch anded with the third user data latch and the second data latch; and updating the value of the first data latch as logically not the first quantity anded with not the data transfer latch during the second verify period of time in response to a last one of the plurality of data states of the normal verify windows being verified.

17. The method as set forth in claim 14, wherein each of the plurality of program loops of the program operation include a first verify period of time and a second verify period of time in which the verification pulses of the plurality of program verify voltages each associated with one of the plurality of data states to selected ones of the plurality of word lines to determine whether the memory cells connected thereto have the threshold voltage above each of the plurality of program verify voltages associated with the plurality of data states targeted for each of the memory cells being programmed, the plurality of data states include an erased data state and a plurality of lower data states comprising one half of the plurality of data states corresponding to the threshold voltage being relatively lower in magnitude and a plurality of higher data states comprising another half of the plurality of data states corresponding to the threshold voltage being relatively higher in magnitude compared to the plurality of lower data states, the verify windows include a plurality of normal verify windows spanning half of the plurality of data states and varying based on which of the plurality of data states have not yet completed programming, and the method further includes the steps of:

extending the at least one of the verify windows by a predetermined number of the plurality of data states for the plurality of higher data states at the first verify period of time in response to the memory cells associated with the one of the specific prior ones of the plurality of data states not finishing programming before the one of the predetermined ones of the at least one of the verify windows is verified; and switching the at least one of the verify windows to the normal verify windows at the second verify period of time in response to finishing verification of the plurality of data states in a last one of the plurality of data states of the at least one of the verify windows that has been extended.

18. The method as set forth in claim 17, wherein each of the memory cells is configured to store four bits and the plurality of data states includes, in order of the threshold voltage increasing in magnitude, the erased data state and a plurality of programmed data states ranging from a first data state to a fifteenth data state, the high data state window includes the plurality of data states ranging from an eighth data state to the fifteenth data state, and the method further includes the steps of:

setting a value of the first data latch as logically the first user data latch anded with not the second user data latch anded with the third user data latch ored with the first data latch; and updating the value of the first data latch as logically the first data latch and the data transfer latch during the second verify period of time in response to a last one of the plurality of data states of the normal verify windows being verified.

19. The method as set forth in claim 13, wherein in a smart program count verify process, the method further includes the steps of:

counting an upper tail quantity of the memory cells associated with an earlier one of the plurality of data states having the threshold voltage above one of the plurality of program verify voltages associated with earlier one of the plurality of data states;

determining whether the upper tail quantity is greater than or equal to a predetermined upper tail threshold;

applying a subsequent one of the series of programming pulses of the program voltage to the selected ones of the plurality of word lines during another of the plurality of program loops of the program operation in response to determining the upper tail quantity is not greater than or equal to the predetermined upper tail threshold; and applying one of the verification pulses of the one of the plurality of program verify voltages associated with a later one of the plurality of data states to the selected ones of the plurality of word lines to determine whether the memory cells connected thereto have the threshold voltage above the one of the plurality of program verify voltages associated with the later one of the plurality of data states without triggering a next program pulse in response to determining the upper tail quantity is greater than or equal to the predetermined upper tail threshold.

20. The method as set forth in claim 19, wherein the memory apparatus also includes a program completion parameter configured to indicate when the memory cells being programmed for one of the plurality of data states have the threshold voltage above one of the plurality of program verify voltages associated with the one of the plurality of data states targeted for the memory cells and the method further includes the step of prioritizing selection of the one of the plurality of data states to verify based on the smart program count verify process rather than the program completion parameter.

* * * * *